US008648666B2

(12) United States Patent
Kawai et al.

(10) Patent No.: US 8,648,666 B2
(45) Date of Patent: Feb. 11, 2014

(54) MULTIMODE FRONTEND CIRCUIT

(75) Inventors: Kunihiro Kawai, Yokohama (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 350 days.

(21) Appl. No.: 13/216,442

(22) Filed: Aug. 24, 2011

(65) Prior Publication Data

US 2012/0049985 A1    Mar. 1, 2012

(30) Foreign Application Priority Data

Aug. 25, 2010 (JP) .................. 2010-188393
May 23, 2011 (JP) .................. 2011-114894

(51) Int. Cl.
*H01P 1/24* (2006.01)
*H03H 7/38* (2006.01)

(52) U.S. Cl.
USPC .................................. 333/22 R; 333/33

(58) Field of Classification Search
USPC .................. 333/22 R, 33, 81 A, 81 R, 101
See application file for complete search history.

(56) References Cited

U.S. PATENT DOCUMENTS

| | | | |
|---|---|---|---|
| 4,697,160 A * | 9/1987 | Clark | ...................... 333/103 |
| 5,162,759 A | 11/1992 | Yajima | |
| 7,135,940 B2 | 11/2006 | Kawakubo et al. | |
| 7,292,124 B2 | 11/2007 | Kawai et al. | |
| 7,583,168 B2 | 9/2009 | Kawai et al. | |
| 2003/0025563 A1 | 2/2003 | Christensen | |

FOREIGN PATENT DOCUMENTS

| | | |
|---|---|---|
| JP | 2001-230602 | 8/2001 |
| JP | 2004-7352 | 1/2004 |
| JP | 2005-217852 | 8/2005 |

OTHER PUBLICATIONS

Dimitrios Peroulis, et al., "Tunable Lumped Components with Applications to Reconfigurable MEMS Filters", IEEE MTT-S Digest, TU4C-6, 2001, pp. 341-344.

Hong-Teuk Kim, et al., "Low-Loss and Compact V-Band MEMS-Based Analog Tunable Bandpass Filters", IEEE Microwave and Wireless Components Letters, vol. 12, No. 11, Nov. 2002, pp. 432-434.

E. Fourn, et al., "Bandwidth and Central Frequency Control On Tunable Bandpass Filter by Using MEMS Cantilevers", IEEE MTT-S Digest, IFTU-21, 2003, pp. 523-526.

Arnaud Pothier, et al., Low-Loss 2-Bit Tunable Bandpass Filters Using MEMS DC Contact Switches, IEEE Transactions on Microwave Theory and Techniques, vol. 53, No. 1, Jan. 2005, pp. 354-360.

(Continued)

*Primary Examiner* — Stephen Jones
(74) *Attorney, Agent, or Firm* — Oblon, Spivak, McClelland, Maier & Neustadt, L.L.P.

(57) ABSTRACT

A multimode frontend circuit of the present invention comprises two transmission paths. Each of the transmission paths comprises two input/output lines, a first transmission line having one end connected to one of the input/output lines and the other end connected to the other input/output line, a second transmission line connected to the one of the input/output lines and the other end connected to the other input/output line, and one or more termination switch circuits. The termination switch circuit or circuits comprise a switch having one end connected to one of the first and second transmission lines and a termination circuit connected to the other end of the switch. Each of the transmission lines may comprise one or more short-circuiting switches. The short-circuiting switch or switches are capable of short-circuiting between the two transmission lines at positions at the same electrical length from one of the input/output lines.

9 Claims, 33 Drawing Sheets

(56) References Cited

OTHER PUBLICATIONS

Bruce E. Carey-Smith, et al., "Wide Tuning-Range Planar Filters Using Lumped-Distributed Coupled Resonators", IEEE Transactions on Microwave Theory and Techniques, vol. 53, No. 2, Feb. 2005, pp. 777-785.

Kamran Entesari, et al., A Differential 4-bit 6.5-10-GHz RF MEMS Tunable Filter, IEEE Transactions on Microwave Theory and Techniques, vol. 53, No. 3, Mar. 2005, pp. 1103-1110.

Kamran Entesari, et al., "A 12-18-GHz Three-Pole RF MEMS Tunable Filter", IEEE Transactions on Microwave Theory and Techniques, vol. 53, No. 8, Aug. 2005, pp. 2566-2571.

Lung-Hwa Hsieh, et al., "Slow-Wave Bandpass Filters Using Ring or Stepped-Impedance Hairpin Resonators", IEEE Transactions on Microwave Theory and Techniques, vol. 50, No. 7, Jul. 2002, pp. 1795-1800.

Kunihiro Kawai, et al., "Tunable Resonator Employing Comb-Shaped Transmission Line and Switches", Proceedings of the 35th European Microwave Conference, Oct. 4-6, 2005, 5 pages.

Arun Chandra Kundu, et al., Attenuation Pole Frequency Control of a Dual-Mode Circular Microstrip Ring Resonator BPF, Proceedings of the 29th European Microwave Conference, Oct. 1999, pp. 329-332.

Kunihiro Kawai, et al., "Tunable Band-pass Filter Employing Comb-shaped Transmission Line Resonator", Electronics Society Conference of the Institute of Electronics, Information and Communication Engineers, C-2-37, 4 pages (with English Translation), Sep. 2006.

Kunihiro Kawai, et al., "Center-frequency and Bandwidth Tunable Band-pass Filter Employing Comb-shaped Transmission Line Resonator", General Conference of the Institute of Electronics, Information and Communication Engineers, C-2-35, 2006, 4 pages (with English Translation).

Kunihiro Kawai, et al., "Center Frequency and Bandwidth Tunable Filter Employing Tunable Comb-Shaped Transmission Line Resonators and J-inverters", Proceedings of the 36th European Microwave Conference, Sep. 2006, pp. 649-652.

Kunihiro Kawai, et al., "Comb-shaped Transmission Line Tunable Resonator Employing MEMS RF Switches", Electronics Society Conference of the Institute of Electronics, Information and Communication Engineers, C-2-77, 2006, 4 pages (with English Translation).

Lei Zhu, et al., "A Joint Field/Circuit Design Model of Microstrip Ring Dual-Mode Filter: Theory and Experiments", Asia Pacific Microwave Conference, 4P18-7, 1997, pp. 865-868.

S. H. Ai-Charchafchi, et al., "Varactor tuned microstrip ring resonators", IEE Proceedings, vol. 136, Pt. H, No. 2, Apr. 1989, pp. 165-168.

T. Scott Martin, et al., "Electronically Tunable and Switchable Filters Using Microstrip Ring Resonator Circuits", IEEE MTT-S Digest, OF-2-22, 1988, pp. 803-806.

P. Gardner, et al., Microwave voltage tuned microstrip ring resonator oscillator, Electronics Letters, vol. 30, No. 21, Oct. 13, 1994, pp. 1770-1771.

Michiaki Matsuo, et al., "Dual-Mode Stepped-Impedance Ring Resonator for Bandpass Filter Applications", IEEE Transaction on Microwave Theory and Techniques, vol. 49, No. 7, Jul. 2001, pp. 1235-1240.

Hitoshi Ishida, et al., "A design of tunable UWB filters", FA4-5, May 2004, pp. 424-428.

Kouki Saitou, et al., "Tunable Duplexer Having Multilayer Structure Using LTCC", IEEE MTT-S Digest, TH1C-5, 2003, pp. 1763-1766.

F. A. Miranda, et al., "A K-Band (HTS,Gold)/Ferroelectric Thin Film/Dielectric Diplexer for a Discriminator-Locked Tunable Oscillator", IEEE Transactions on Applied Superconductivity, vol. 9, No. 2, Jun. 1999, pp. 3581-3584.

Kunihiro Kawai, et al., "Ring Resonators for Bandwidth and Center Frequency Tunable Filter", Proceedings of the 37th European Microwave Conference, Oct. 2007, pp. 298-301.

Kunihiro Kawai, et al., "Tunable Ring Resonator Filter for Duplexer", Proceedings of the 38th European Microwave Conference, Oct. 2008, pp. 603-606.

Kunihiro Kawai, et al., "Center Frequency, Bandwidth, and Transfer Function Tunable Bandpass Filter Using Ring Resonator and J-inverter", Proceedings of the 39th European Microwave Conference, Sep. 29, 2009-Oct. 1, 2009, pp. 1207-1210.

Kunihiro Kawai, et al., "Reconfigurable Microwave-Band Bandpass Filter", IEEE International Conference on Wireless Information Technology and Systems, Aug. 2010, 5 pages.

Kunihiro Kawai, et al., "Tunable Bandpass Filter with Symmetric Attenuation Characteristics", Proceedings of Asia-Pacific Microwave Conference, WE3B-2, Dec. 2010, 5 pages.

Masaaki Koiwa, et al., "Multiband Mobile Terminals", NTT DoCoMo Technical Journal, vol. 14, No. 2, Technology Reports, Jul. 2006, 15 pages (with English Translation).

Takashi Okada, "Mobile, Terminal RF Circuit Technology for Increasing Capacity/Coverage and International Roaming", NTT DoCoMo Technical Journal, vol. 10, No. 2, Technology Reports, Jul. 2008, 19 pages (with English Translation).

* cited by examiner

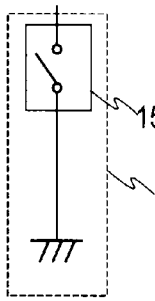
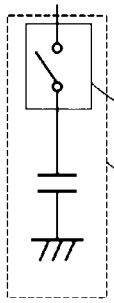
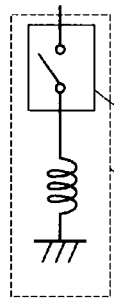
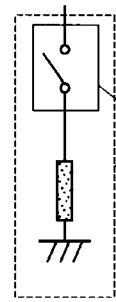
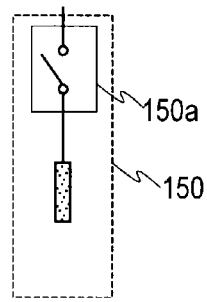
FIG. 2A  FIG. 2B  FIG. 2C  FIG. 2D  FIG. 2E
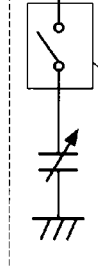
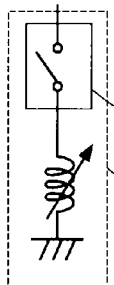
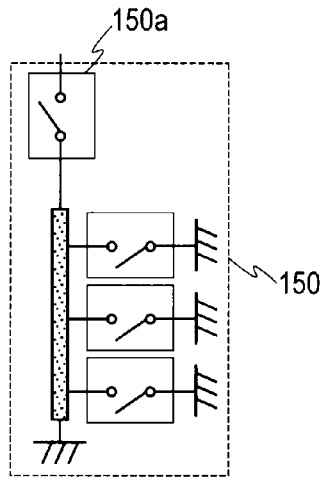
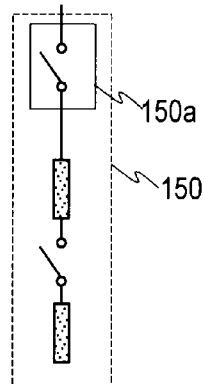
FIG. 2F  FIG. 2G  FIG. 2H  FIG. 2I
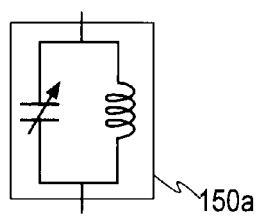
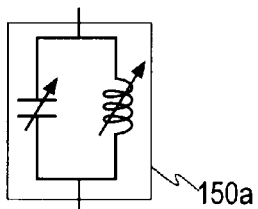
FIG. 3A  FIG. 3B 6.18GHz 6GHz 6.18GHz 6GHz

MULTIMODE FRONTEND CIRCUIT

TECHNICAL FIELD

The present invention relates to a multimode frontend circuit performing transmission and reception.

BACKGROUND ART

In the field of wireless communications using radio waves, a technique called Frequency Division Duplex (FDD) in which one frequency band is used to transmit and another is used to receive a transmission is used in communication schemes such as W-CDMA. If a station uses one antenna to perform the bidirectional communication, the station uses a duplexer to prevent a signal transmitted from the station from entering a system that directly receives signals from other stations. The frequency characteristics of the duplexer is typically invariant. Therefore, for example in a communication device that uses multiple frequencies or bandwidths, duplexers for the respective frequencies or bandwidths are provided and a switch is used to make switching between them (Masaaki Koiwa, Fumiyoshi Inoue, and Takashi Okada, "Multiband Mobile Terminals", NTT DoCoMo Technical Journal Vol. 14, No. 2, pp. 31-37, July, 2006).

There is another technique called Time Division Duplex (TDD) in which transmission and reception are performed with the same frequency in different timings. In the TDD, sharing of an antenna is generally accomplished by using a switch. Global System for Mobile Communications (GSM), which is not a TDD system, makes switching between transmission and reception using a switch, like the TDD. Accordingly, terminals supporting the GSM use a switch to use an antenna for both transmission and reception. Mobile terminals that support both W-CDMA, which uses FDD, and GSM include transmission/reception systems for both schemes and use a switch to make switching between the systems (Takashi Okada, "Mobile Terminal RF Circuit Technology for Increasing Capacity/Coverage and International Roaming", NTT DoCoMo Technical Journal Vol. 16, No. 2, pp. 45-53, July, 2008). Since TDD uses the same frequency for transmission and reception, the duplexer described above cannot be provided in transmission and reception paths. Therefore, a communication device that supports both FDD and TDD requires transmission/reception systems for FDD and transmission/reception systems for TDD.

However, these methods have a problem that the circuit area and the number of components increase as the number of frequencies or bandwidths used increases. Furthermore, the need for transmission and reception circuits for both FDD and TDD also leads to increase in the circuit area and the number of components.

In view of these circumstances, an object of the present invention is to provide a circuit that function as both of a duplexer whose frequency band and/or center frequency can be changed and a switch for TDD, that is, to provide a multimode frontend circuit.

SUMMARY OF THE INVENTION

A multimode frontend circuit of the present invention comprises first, second and third ports, a first transmission path between the first port and the second port and a second transmission path between the first port and the third port. Each of the transmission path comprises two input/output lines, a first transmission line having one end connected to one of the input/output lines and the other end connected to the other input/output line, a second transmission line having one end connected to the one of the input/output lines and the other end connected to the other of the input/output lines, and one or more termination switch circuits. The electrical length of the first transmission line is equal to the electrical length of the second transmission line. The characteristic impedance for the even mode and the characteristic impedance for the odd mode of the first transmission line are constant along the length of the first transmission line. The characteristic impedance for the even mode and the characteristic impedance for the odd mode of the second transmission line are constant along the length of the second transmission line. The characteristic impedance for the even mode of the first transmission line is equal to the characteristic impedance for the even mode of the second transmission line. The characteristic impedance for the odd mode of the first transmission line is equal to the characteristic impedance for the odd mode of the second transmission line. The termination switch circuit comprises a switch having one end connected to one of the first and second transmission lines and a termination circuit connected to the other end of the switch. Each of the transmission paths may comprise one or more short-circuiting switches. The short-circuiting switch or switches are capable of short-circuiting between the two transmission paths at points at the same electrical length each other from one of the input/output lines.

Effects of the Invention

The multimode frontend circuit of the present invention enables setting of a transmission frequency and a rejection frequency for each transmission path by turning on and off the termination switch circuit and also enables switching between transmission paths to transmit a signal according to time. That is, the function of a duplexer whose bandwidth or a center frequency can be changed and the functions of a switch for TDD can be provided by the same circuit, that is, a multimode frontend circuit.

BRIEF DESCRIPTION OF THE DRAWINGS

FIG. 2A is a diagram illustrating an exemplary configuration of a switch circuit having a switch 150a one end of which is directly grounded;

FIG. 2B is a diagram illustrating an exemplary configuration of a switch circuit including a capacitor one end of which is connected to a switch 150a and the other end of which is grounded;

FIG. 2C is a diagram illustrating an exemplary configuration of a switch circuit including an inductor one end of which is connected to a switch 150a and the other end of which is grounded;

FIG. 2D is a diagram illustrating an exemplary configuration of a switch circuit including a transmission line one end of which is connected to a switch 150a and the other end of which is grounded;

FIG. 2E is a diagram illustrating an exemplary configuration of a switch circuit including a transmission line one end of which is connected to a switch 150a and the other end of which is open;

FIG. 2F is a diagram illustrating an exemplary configuration of a switch circuit including a variable capacitor with variable capacitance one end of which is connected to a switch 150a and the other end of which is grounded;

FIG. 2G is a diagram illustrating an exemplary configuration of a switch circuit including a variable inductor with variable inductance one end of which is connected to a switch 150a and the other end of which is grounded;

FIG. 2H is a diagram illustrating an exemplary configuration of a switch circuit including a transmission line one end of which is connected to a switch 150a and the other end of which is grounded;

FIG. 2I is a diagram illustrating an exemplary configuration of a switch circuit including transmission lines connected in series with each other through a switch and a switch 150a connected to one end of one of the transmission lines;

FIG. 3A is a diagram illustrating an exemplary configuration of a parallel resonator circuit whose first resonance frequency is variable;

FIG. 3B is a diagram illustrating an exemplary configuration of a parallel resonator circuit whose second resonance frequency is variable;

DETAILED DESCRIPTION OF THE EMBODIMENTS

Before describing the present invention, part of Japanese Patent Application No. 2010-049126 (filed on Mar. 5, 2010), which is an unpublished patent application filed by the present applicant, will be described first. Applications equivalent to the basic Japanese patent application were filed in the U.S., Europe, China and Korea with patent application numbers U.S. Ser. No. 13/040,717 (filed on Mar. 4, 2011), EP 11 156 817.6 (filed on Mar. 3, 2011), CN201110053567.1 (filed on Mar. 7, 2011) and KR10-2011-0018451 (filed on Mar. 2, 2011).

Figure 1A:
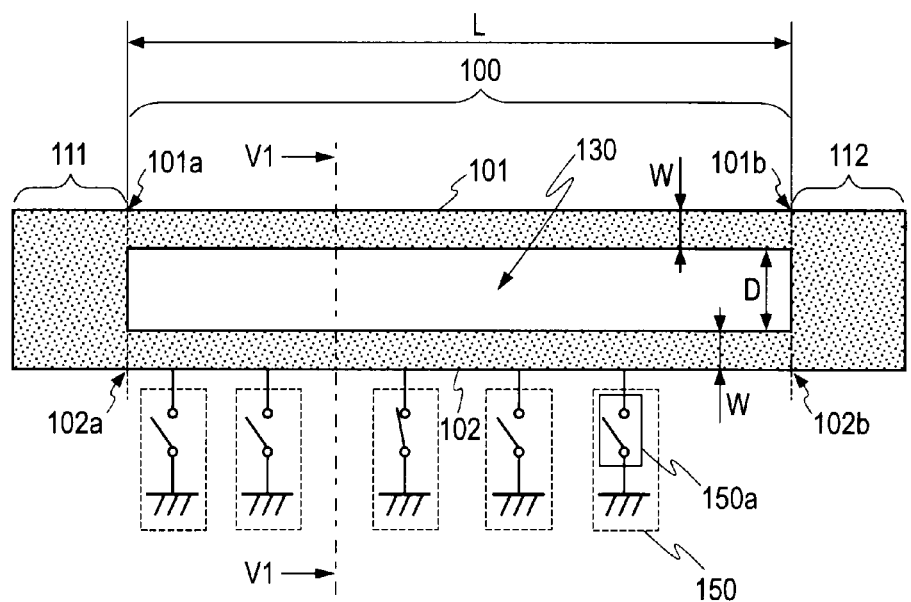
FIG. 1A is a diagram illustrating a functional configuration of a variable resonator described in an unpublished patent application.
Figure 1B:
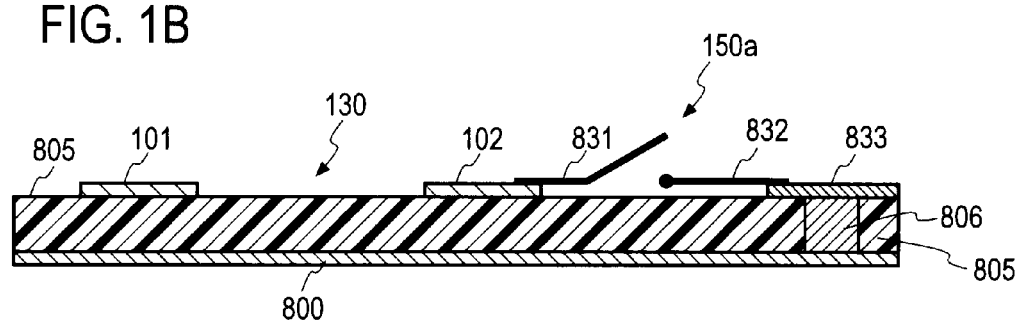
FIG. 1B is a cross-sectional view illustrating the functional configuration of the variable resonator in the unpublished patent application.

FIG. 1A illustrates a variable resonator 100 having a microstrip line structure, which is one embodiment in Japanese Patent Application No. 2010-049126. FIG. 1B is a cross-sectional view of the variable resonator 100. The variable resonator 100 comprises two transmission lines 101 and 102 and multiple switch circuits 150. In the embodiment illustrated in FIG. 1A, the two rectangular transmission lines 101 and 102 are formed on a dielectric substrate 805. One end 101a of the first transmission line 101 is connected to an input line 111 formed on the dielectric substrate 805 and the other end 101b of the first transmission line 101 is connected to an output line 112 formed on the dielectric substrate 805. One end 102a of the second transmission line 102 is connected to the input line 111 and the other end 102b of the second transmission line 102 is connected to the output line 112. The two transmission lines 101 and 102 are made of a conductive material such as metal and are formed on one surface of the dielectric substrate 805. A ground conductor 800 of a conductive material such as metal is formed on the other surface (backside) of the dielectric substrate 805. The dielectric substrate 805 is exposed in the area, indicated by reference numeral 130, enclosed by the two transmission lines 101 and 102, the input line 111 and the output line 112.

Requirements of the two transmission lines 101 and 102 are that:

(1) the electrical length of the first transmission line 101 is equal to the electrical length of the second transmission line 102;

(2) the characteristic impedance for the even mode and the characteristic impedance for the odd mode of the first transmission line 101 are constant along the length of the first transmission line 101;

(3) the characteristic impedance for the even mode and the characteristic impedance for the odd mode of the second transmission line 102 are constant along the second transmission line 102;

(4) the characteristic impedance for the even mode of the first transmission line 101 is equal to the characteristic impedance for the even mode of the second transmission line 102; and (5) the characteristic impedance for the odd mode of the first transmission line 101 is equal to the characteristic impedance for the odd mode of the second transmission line 102.

For example, if the dielectric substrate 805 has a uniform thickness and a uniform relative permittivity over its length and breadth, the two transmission lines 101 and 102 will satisfy requirements (1) to (5) if the transmission lines 101 and 102 are formed in such a manner that:

(a) the length of the first transmission line 101 is equal to the length of the second transmission line 102;

(b) the line width of the first transmission line 101 is equal to the line width of the second transmission line 102; and (c) the distance (indicated by D in FIG. 1A) between the first transmission line 101 and the second transmission line 102 is constant. In the variable resonator 100 illustrated in FIG. 1A, the two transmission lines 101 and 102 have the same line length L and the same line width W and are formed on the dielectric substrate 805 in parallel to each other at a distance D from each other with a gap 130 between them, on the assumption that the dielectric substrate 805 has a uniform thickness and a uniform relative permittivity over its length and breadth.

If the dielectric substrate 805 does not have a uniform thickness and/or relative permittivity, the two transmission lines 101 and 102 are formed so that requirements (1) to (5) are satisfied by taking into consideration the thickness and distribution of the relative permittivity of the dielectric substrate 805. Such a design can be accomplished by any known technique and therefore detailed description of the design will be omitted.

The variable resonator 100 illustrated in FIG. 1A comprises five switch circuits 150 (only one of the switch circuits is given the reference numeral for simplicity of the drawing). In the variable resonator 100, the switch circuits 150 are connected only to the second transmission line 102. However, the present embodiment is not limited to this configuration; the switch circuits 150 need only to be connected to one of the first transmission line 101 and the second transmission line 102. While specific exemplary configurations of the switch circuits 150 will be described later, each of the switch circuits 150 in the example illustrated in FIG. 1A comprises a switch 150a one end of which is connected to one of the first transmission line 101 and the second transmission line 102 and the other end of which is grounded. Each of the switches 150a has one end 831 connected to the second transmission line 102 and the other end 832 electrically connected to the ground conductor 800 through a conductor 833 and a via hole 806 as illustrated in FIG. 1B. There is no limitation on the shape of the conductor 833 and therefore the conductor 833 is omitted from the other drawings.

The switch circuits 150 are connected at [1] locations on the first transmission line 101 at different electrical lengths from one end 101a of the first transmission line 101 (locations excluding the end 101a and the other end 101b) and at [2] locations on the second transmission line 102 at different electrical lengths from one end 102a of the second transmission line 102 (locations excluding the end 102a and the other end 102b). In such a configuration, the electrical length $\theta_1$ from the location on the first transmission line 101 at which a switch circuit is connected to the end 101a is possibly equal to the electrical length $\theta_2$ from the location on the second transmission line 102 at which a switch circuit is connected to the end 102a. If $\theta_1=\theta_2$, the switch circuit connected at the location on the first transmission line 101 at an electrical length $\theta_1$ from the end 101a and the switch circuit connected at the location on the second transmission line 102 at a electrical length $\theta_2$ from the end 102a should not be turned on at the same time. When the variable resonator 100 is caused to operate as a resonator as described later, only one of the switch circuits 150 is turned on. From this perspective, it is useless to connect switch circuits 150 at the locations on the first transmission line 101 and the second transmission line 102 at an equal electrical length from the input line 111. Therefore, in addition to requirements [1] and [2] described above, the following requirement concerning the connection locations of the switch circuits 150 may be set: [3] the electrical length of each switch circuit 150 connected to one of the two transmission lines 101 and 102 from one end of the transmission line is not equal to the electrical lengths of any of the switch circuits 150 connected to the other transmission line from one end of that transmission line.

In the variable resonator 100, when one of the switch circuits 150 is turned on, a bandwidth corresponding to the location at which the switch circuit is connected is provided; when another switch circuit is turned on, another bandwidth corresponding to the location at which that switch circuit is connected is provided. Therefore, the bandwidth of the variable resonator 100 can be changed by turning on a different switch circuit.

FIGS. 2A to 2I illustrate exemplary configurations of the switch circuits 150. A switch circuit 150 illustrated in FIG. 2A has a switch 150a the other end of which is directly grounded. A switch circuit 150 illustrated in FIG. 2B includes a capacitor one end of which is connected to a switch 150a and the other end of which is grounded. A switch circuit 150 illustrated in FIG. 2C includes an inductor one end of which is connected to a switch 150a and the other end of which is grounded. A switch circuit 150 illustrated in FIG. 2D includes a transmission line one end of which is connected to a switch 150a and the other end of which is grounded. In this configuration, the transmission line has a line length equal to one quarter (¼) wavelength at the operating frequency in the on-state of the switch circuit. A switch circuit 150 illustrated in FIG. 2E includes a transmission line one end of which is connected to a switch 150a and the other end of which is open.

In this configuration, the transmission line has a line length equal to a half (½) wavelength at the operating frequency in the on-state of the switch circuit. A switch circuit 150 illustrated in FIG. 2F includes a variable capacitance with variable capacitance one end of which is connected to a switch 150a and the other end of which is grounded. A switch circuit 150 illustrated in FIG. 2G includes a variable inductor with variable inductance one end of which is connected to a switch 150a and the other end of which is grounded. A switch circuit 150 illustrated in FIG. 2H includes a transmission line one end of which is connected to a switch 150a and the other end of which is grounded. One or more switches are connected onto the transmission line and the other end of each of the switches is grounded. By turning on and off the switches, the characteristics of the switch circuit 150 can be changed. A switch circuit 150 illustrated in FIG. 2I includes transmission lines connected in series with each other through a switch and a switch 150a connected to one end of one of the transmission lines. By turning on and off the switch between the transmission lines, the characteristics of the switch circuit 150 can be changed.

The switches 150a are not limited to contact switches. For example, the switches 150a may be so-called switching elements, such as diodes or transistors, for example, that have the function of connecting and disconnecting a circuit without using a contact on a circuit network. Alternatively, the switches 150a may be switches using MEMS (Micro ElectroMechanical Systems) technology. The switching elements are not limited to ohmic switches, which pass direct current when the switching elements are on. The switching elements may be capacitive switches, which block a direct current but pass an alternating current when the switching elements are on. Alternatively, as illustrated in FIGS. 3A and 3B, a parallel resonant circuit whose resonance frequency can be changed may be used. In this case, the characteristics of the parallel resonant circuit are set so that the resonance frequency of the parallel resonant circuit will be equal to the resonance frequency of a variable resonator made up of two transmission lines 101 and 102 when the switch circuit 150 is to be turned off, and that the resonance frequency of the parallel resonant circuit does not resonate at the resonance frequency of the variable resonator made up of the two transmission lines 101 and 102 when the switch circuit 150 is to be turned on. For example, the resonance frequency of the parallel resonant circuit can be changed by changing the capacitance of a variable capacitor or the inductance of a variable inductor, as illustrated in FIGS. 3A and 3B. The configuration of the switch circuit 150 is not limited to those described above. While the frequency characteristics of the variable resonator can be changed as desired by varying the configuration of the switch circuit 150, the resonance frequency of the variable resonator is determined by the line length of the two transmission lines 101 and 102 and therefore remains the same.

The foregoing is description of part of Japanese Patent Application No. 2010-049126 that is at least required to explain the present invention. However, the present invention is not limited to the specifics described above. Other specifics in Japanese Patent Application No. 2010-049126 can also be applied to the present invention. Embodiments of the present invention will be described below in detail. Components having like functions are given like reference numerals and repeated description thereof will be omitted.

First Embodiment

Figure 4:
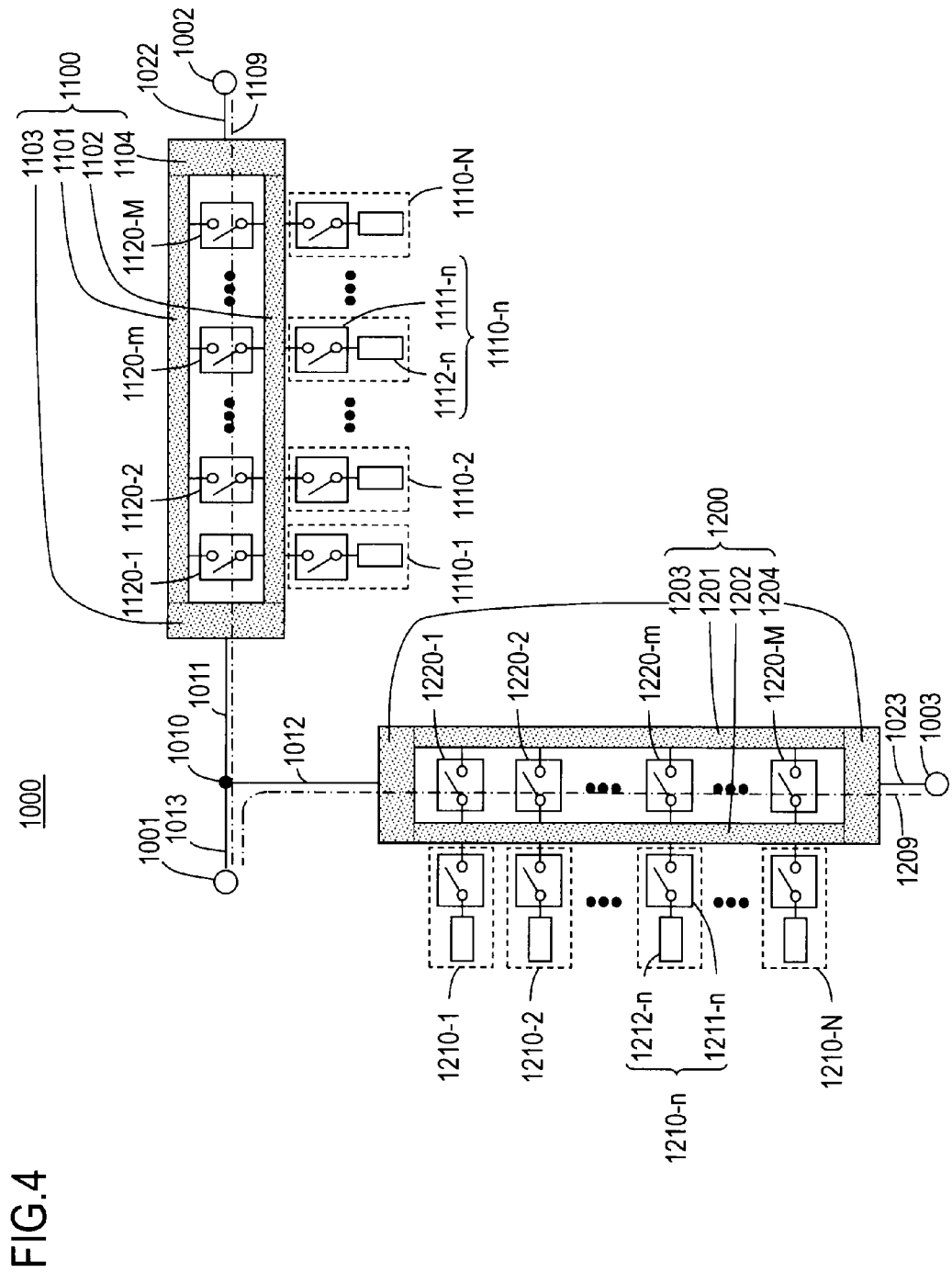
FIG. 4 is a diagram illustrating a configuration of a multimode frontend circuit of the present invention.

FIG. 4 illustrates a configuration of a multimode frontend circuit of a first embodiment. The multimode frontend circuit of the first embodiment may be fabricated with micro-strip lines. The multimode frontend circuit 1000 comprises three ports 1001, 1002 and 1003, a first transmission path 1109 between the first port 1001 and the second port 1002, and a second transmission path 1209 between the first port 1001 and the third port 1003. Each transmission path 1109 (1209) comprises two input/output lines 1103 and 1104 (1203 and 1204), a first transmission line 1101 (1201), a second transmission line 1102 (1202), one or more termination switch circuits 1110-1, . . . , 1110-N (1210-1, . . . , 1210-N) (where N is an integer greater than or equal to 1 and n in FIG. 4 is an integer between 1 and N, inclusive). The first transmission line 1101 (1201) has one end connected to one of the input/output lines 1103 (1203) and the other end connected to the other input/output line 1104 (1204). The second transmission line 1102 (1202) has one end connected to one of the input/output line 1103 (1203) and the other end connected to the other input/output line 1104 (1204). Each transmission path 1109 (1209) comprises one or more short-circuiting switches 1120-1, . . . , 1120-M (1220-1, . . . , 1220-M) (where M is an integer greater than or equal to 1 and m in FIG. 4 is an integer between 1 and M, inclusive). Each of the short-circuiting switches is capable of short-circuiting between the two transmission lines 1101 and 1102 (1201 and 1202) at points at the same electrical length from the input/output line 1103 (1203). The set of the transmission lines 1101 and 1102 (1201 and 1202) and the input/output lines 1103 and 1104 (1203 and 1204) will be referred to as the transmission line 1100 (1200).

The transmission line 1100 (1200) is not necessarily limited to a straight line provided that if it satisfies the requirement (1) to (5) described above; the transmission line 1100 (1200) may be a curve. The electrical length of the first transmission line 1101 (1201) is equal to the electrical length of the second transmission line 1102 (1202). The characteristic impedances for the even mode and the odd mode of the first transmission line 1101 (1201) are constant along the length of the first transmission line 1101 (1201). The characteristic impedance for the even and odd modes of the second transmission line 1102 (1202) are constant along the length of the transmission line 1102 (1202). The characteristic impedance for the even mode of the first transmission line 1101 (1201) is equal to the characteristic impedance for the even mode of the second transmission line 1102 (1202). The characteristic impedance for the odd mode of the first transmission line 1101 (1201) is equal to the characteristic impedance for the odd mode of the second transmission line 1102 (1202). The termination switch circuit 1110-n (1210-n) comprises a switch 1111-n (1211-n) one end of which is connected to one of the first transmission line 1101 (1201) and the second transmission line 1102 (1202), and a termination circuit 1112-n (1212-n) connected to the other end of the switch 1111-n (1211-n).

The first port 1001 is connected to the input/output line 1103 through lines 1013 and 1011. The first port 1001 is also connected to the input/output line 1203 through the line 1013 and a line 1012. The second port 1002 is connected to the input/output line 1104 through a line 1022. The third port 1003 is connected to the input/output line 1204 through a line 1023. The connection point of the lines 1011, 1012 and 1013 will be referred to as the intersection 1010 (or the intersection 1010 of two transmission paths). The lines 1011, 1012 and 1013 depict that the first port 1001 is electrically connected to the input/output lines 1103 and 1203. In reality, the multimode frontend circuit has a length that is negligible in design.

Figure 5:
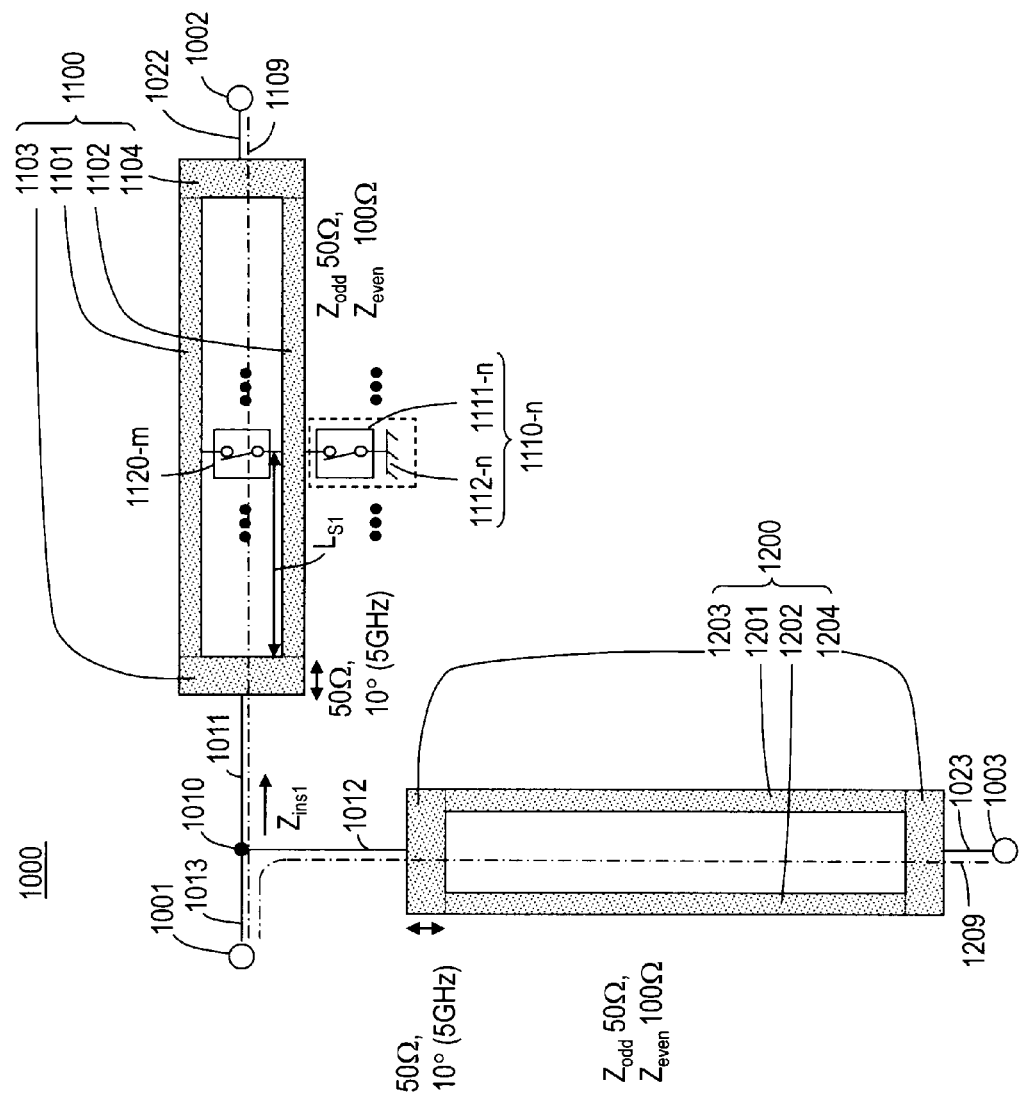
FIG. 5 illustrates a circuit model of the multimode frontend circuit of the present invention functioning as a switch.

An operation of the multimode frontend circuit 1000 functioning as a switch (to switch between transmission lines to propagate a signal according to time in order to support TDD) will be described first. FIG. 5 illustrates a circuit model illustrating the switching operation. It is assumed here that the characteristic impedances of the parallel transmission lines are 100Ω for the even mode and 50Ω for the odd mode for both the transmission paths 1109 and 1209. It is also assumed here that the electrical lengths of the parallel lines are 300° at 5 GHz. The characteristic impedance and electrical length of the input/output line 1103 are 50Ω and 10°, respectively, at 5 GHz. It is assumed that the electrical lengths in the following description are electrical lengths at 5 GHz, unless otherwise stated. The electrical lengths in the transmission path 1209 do not necessarily need to be the same as those in the transmission path 1109. The termination circuit 1112-n connected to the switch 1111-n is a ground conductor herein. It is assumed that the transmission lines 1100 and 1200 and the switches 1111-n and 1120-m are ideal. In particular, the switches 1111-n and 1120-m are ideal when the impedance in the off state is infinite and the impedance in the on state is short-circuit impedance. For simplicity, the switches 1111-1, . . . , 1111-n−1, 1111-n+1, . . . , 1111-N, 1120-1, . . . , 1120-m−1, 1120-m+1, . . . , 1120-M, 1211-1, . . . , 1211-N, 1220-1, . . . , 1220-M which are in the off state are omitted from FIG. 5 and only the switches 1111-n and 1120-m in the on state are depicted. The termination circuits (here, the ground conductors as stated above) connected to the switches in the off state are also omitted.

Requirements for causing the circuit in FIG. 5 to function as a switch will be described below. To block signal propagation in the transmission path 1109 (1209), the switches 1111-n and 1120-m (1211-n and 1200-m) at the same location on the transmission line 1100 (1200) are both turned on. The location is indicated by $L_{S1}$ and the value of $L_{S1}$ is determined by a method which will be described later. For the transmission path 1109 in FIG. 5, the switches 1111-n and 1120-m at the same location on the transmission line 1100 are in the on state. Accordingly, a signal with a frequency corresponding to the location of the switches 1111-n and 1120-m is blocked.

In the transmission path 1209 (1109) through which a signal is to be propagated, on the other hand, the switches 1211-n and 1220-m (1111-n and 1120-m) at the same locations on the transmission line 1200 (1100) are not turned on. In FIG. 5, all switches on the transmission path 1209 are in the off state. Accordingly, a signal input in the transmission path 1209 is output to the third port 1003. If only a signal with a particular frequency is to be passed through the transmission path 1209, the switches 1211-n and 1220-m are turned on appropriately to allow the transmission line 1200 of the transmission path 1209 to function as filter, as will be described later. However, the switches 1211-n and 1220-m at the same location on the transmission line 1200 should not to be turned on at the same time, as stated in the requirements above.

Figure 6A:
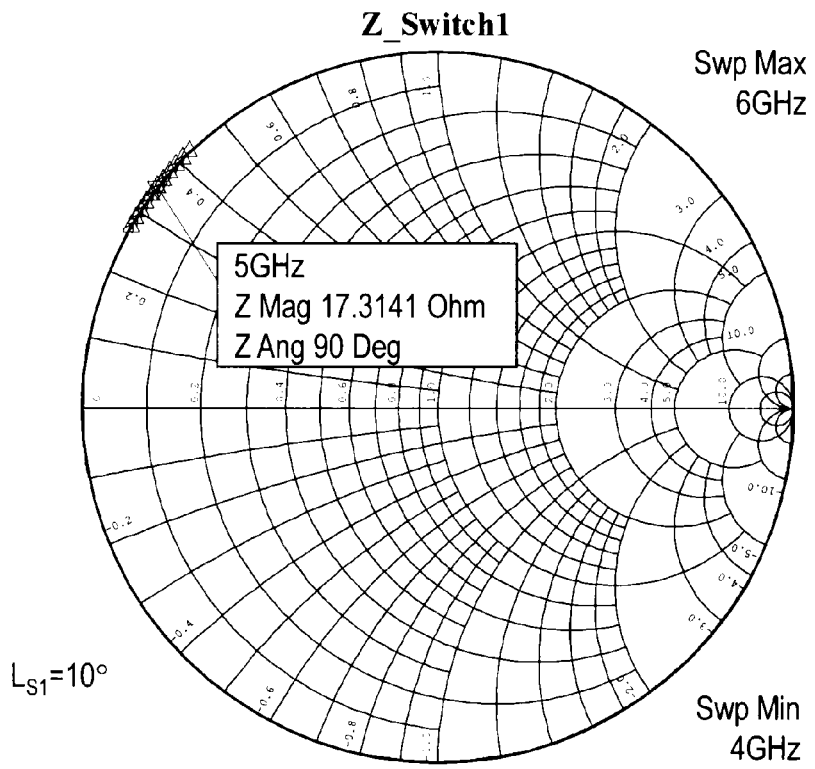
FIG. 6A is a diagram illustrating impedance $Z_{ins1}$ between 4 and 6 GHz when $L_{S1}$ is set at 10°.
Figure 6B:
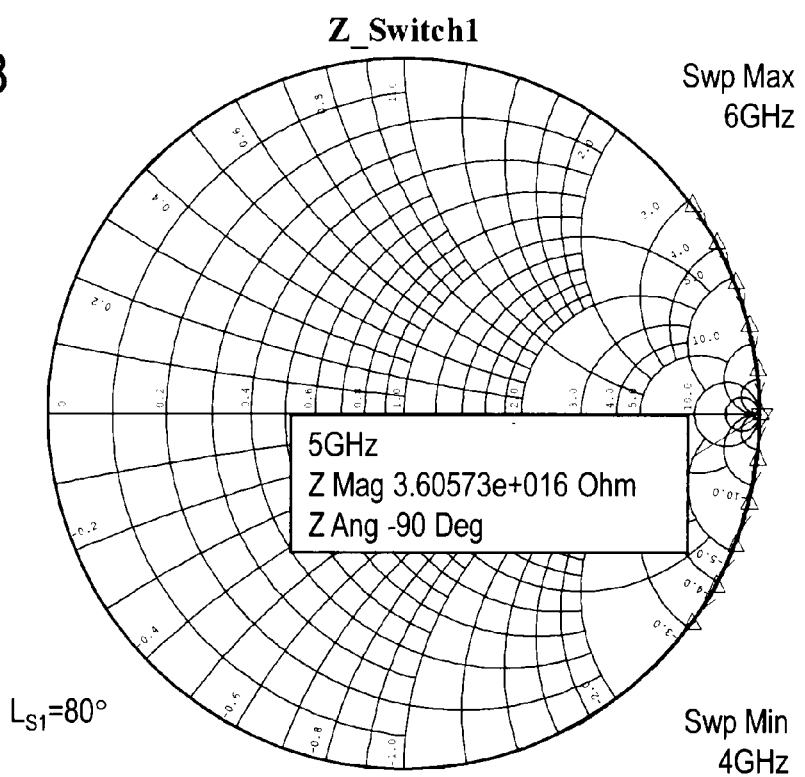
FIG. 6B is a diagram illustrating impedance $Z_{ins1}$ between 4 and 6 GHz when $L_{S1}$ is 80°.
Figure 7:
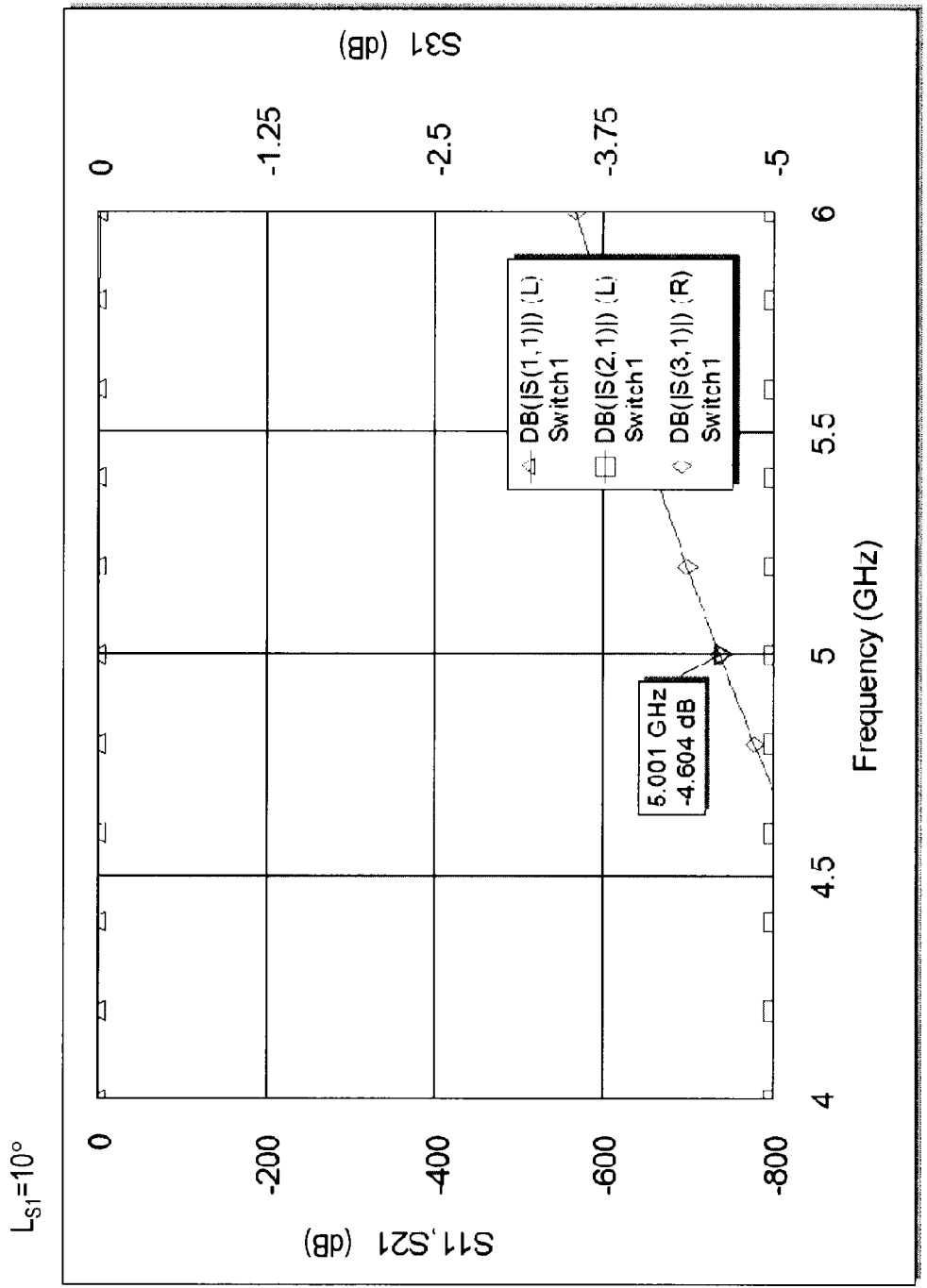
FIG. 7 is a diagram illustrating an S-parameter when $L_{S1}$ is set at 10°.
Figure 8:
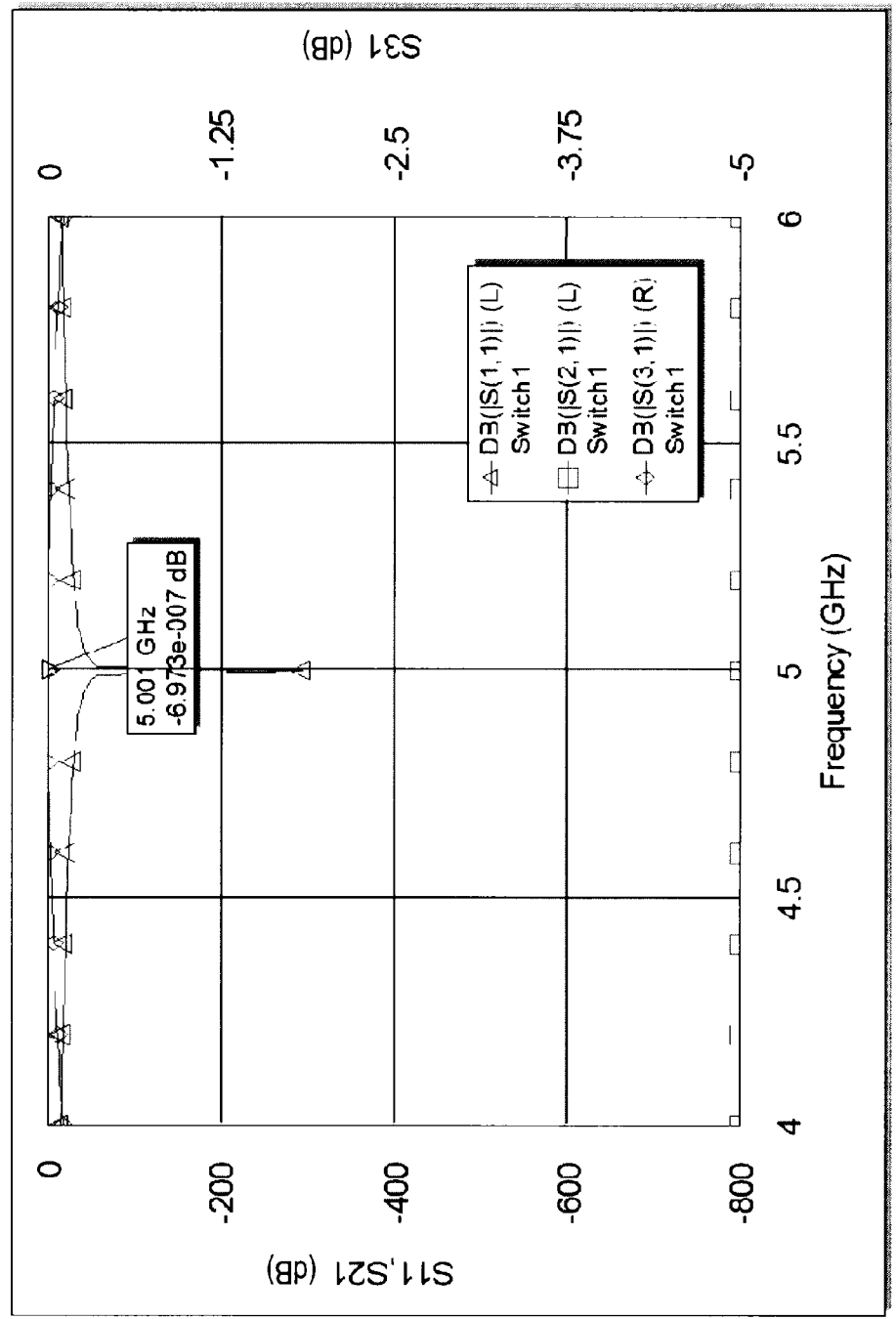
FIG. 8 is a diagram illustrating an S-parameter when $L_{S1}$ is set at 80°.

How to determine the location $L_{S1}$, of switches to be turned on in a transmission path in which signal propagation is to be blocked will be described below. FIGS. 6A, 6B, 7 and 8 illustrate impedances $Z_{ins1}$ and S-parameters at $L_{S1}$ of 10° and 80° when the transmission path 1109 is viewed from the intersection 1010 of the transmission paths 1109 and 1209. FIG. 6A illustrates impedance $Z_{ins1}$ at frequencies between 4 and 6 GHz at $L_{S1}$ of 10°. FIG. 6B illustrates impedance $Z_{ins1}$ at frequencies between 4 and 6 GHz at $L_{S1}$ of 80°. FIG. 7 illustrates the S-parameter at $L_{S1}$ of 10°. FIG. 8 illustrates the S-parameter at $L_{S1}$ of 80°. In FIGS. 7 and 8, S11 represents the reflection coefficient of a signal input through the first port 1001 (the line with triangular marks), S21 represents the transmission coefficient from the first port 1001 to the second port 1002 (the line with square marks), and S31 represents the transmission coefficient from the first port 1001 to the third port 1003 (the line with rhombic marks).

The case at $L_{S1}$ of 10° will be described first. At 10°, $Z_{ins1}$ has a value close to 0 at 5 GHz. S21 is approximately −800 dB at frequencies between 4 and 6 GHz, which indicates that signals are successfully blocked. This is because both of the switches 1111-*n* and 1120-*m* at location $L_{S1}$ are turned on and as a result the transmission path 1109 has become equivalent to a short-circuit stub made up of the input/output line 1103 and a transmission line with a length of $L_{S1}$ to prevent the signals from propagating to the line on the second port side from $L_{S1}$. On the other hand, S31 at 5 GHz is approximately −4.6 dB, which indicates that the signal has passed with a somewhat high loss. This is because $Z_{ins1}$ is small and some signals do not propagate to the third port 1003 but is reflected to the first port 1001. If $Z_{ins1}$ were infinite, all signals input through the first port 1001 would be transmitted to the third port 1003 as if the transmission path 1109 from the intersection 1010 to the second port 1002 were absent.

At $L_{S1}$ of 80°, $Z_{ins1}$ is infinite nearly infinite at 5 GHz as apparent from FIG. 6B. At this point, S31 is almost 0 at 5 GHz and the transmission is almost lossless. That is, the signal has propagated to the port 1003 almost losslessly. If a signal of 4 GHz, for example, is to be allowed to propagate with a minimum loss, $L_{S1}$ is set such that $Z_{ins1}$ at 4 GHz approaches infinite. In this way, setting $L_{S1}$ such that $Z_{ins1}$ approaches infinite at a frequency near the frequency of a signal to be propagated to the third port 1003 allows the signal to more efficiently propagate to the third port 1003.

Variation

Figure 9:
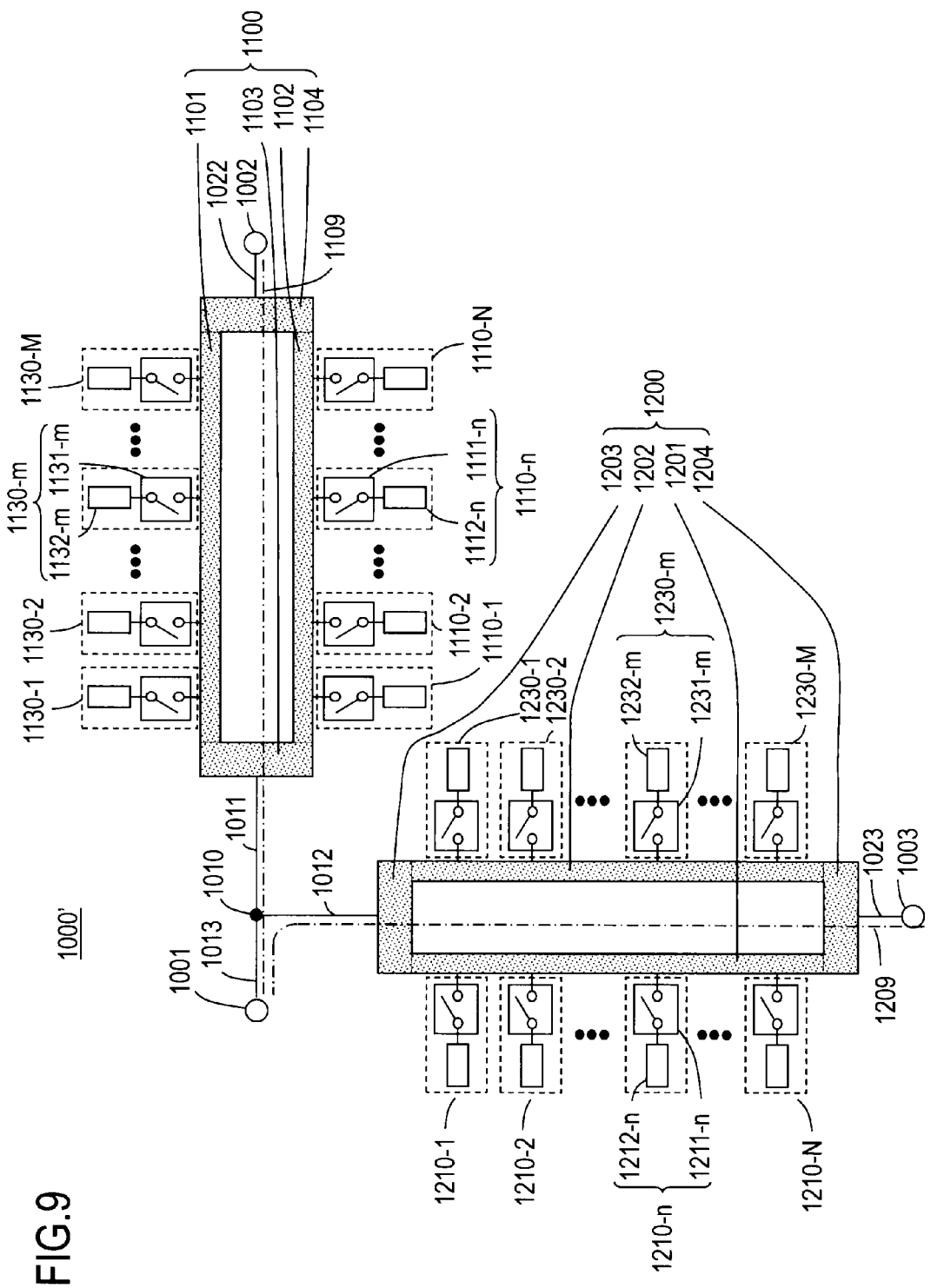
FIG. 9 is a diagram illustrating an another configuration of the multimode frontend circuit of the present invention.

By making a slight change to the circuit configuration in FIG. 4 as illustrated in FIG. 9, the operation of the switches 1111-*n*, 1120-*m*, 1211-*n* and 1220-*m* described above can be accomplished without using short-circuiting switches 1120-1, ..., 1120-M (1220-1, ..., 1220-M). FIG. 9 illustrates a configuration of a multimode frontend circuit having termination switch circuits attached to both of parallel lines. In the multimode frontend circuit 1000', termination switch circuits 1130-1, ..., 1130-M and 1230-1, ..., 1230-M are provided in place of the short-circuiting switches 1120-1, ..., 1120-M and 1220-1, ..., 1220-M.

Figure 10:
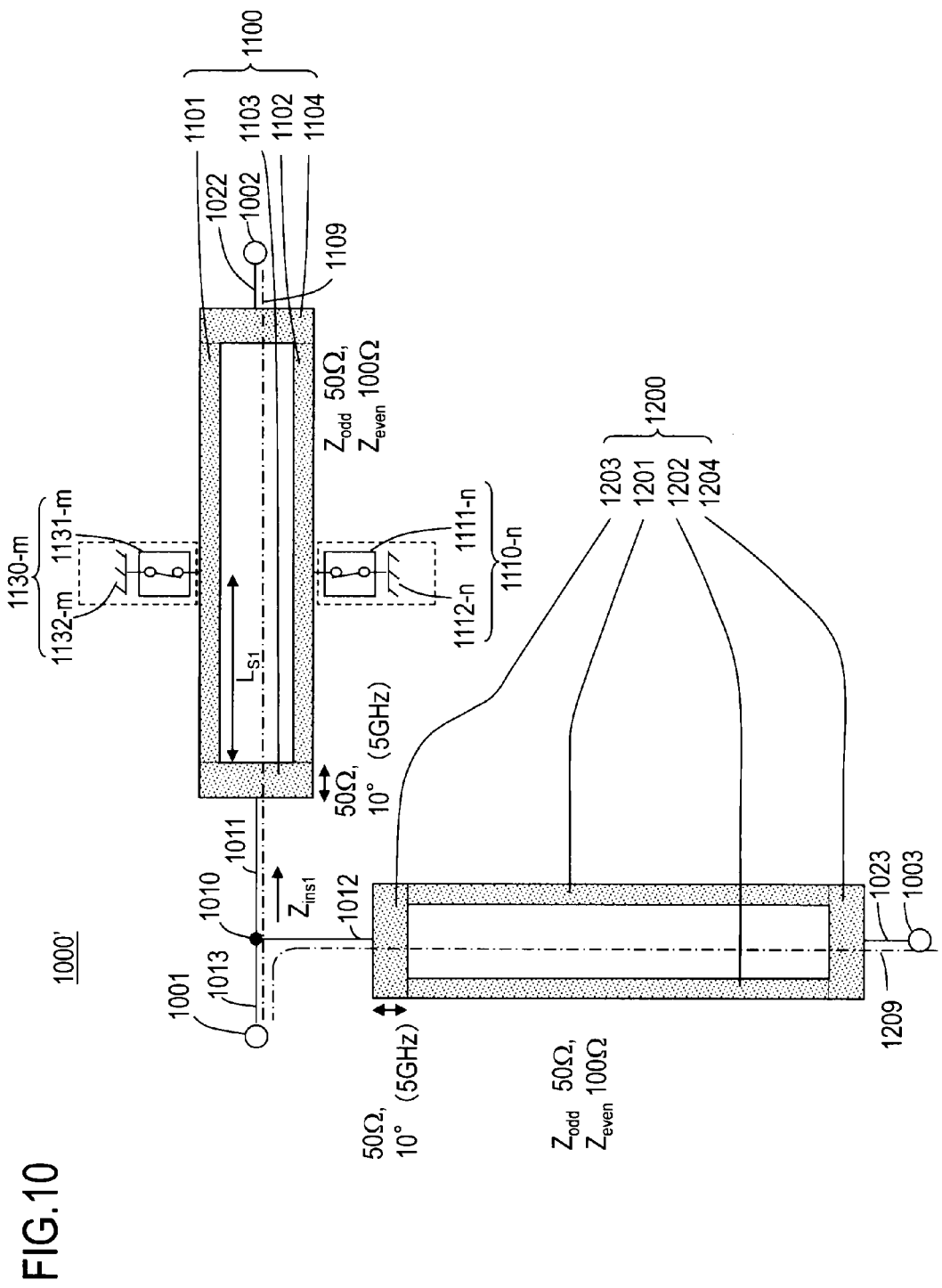
FIG. 10 illustrates a circuit model of another multimode frontend circuit of the present invention functioning as a switch.
Figure 11A:
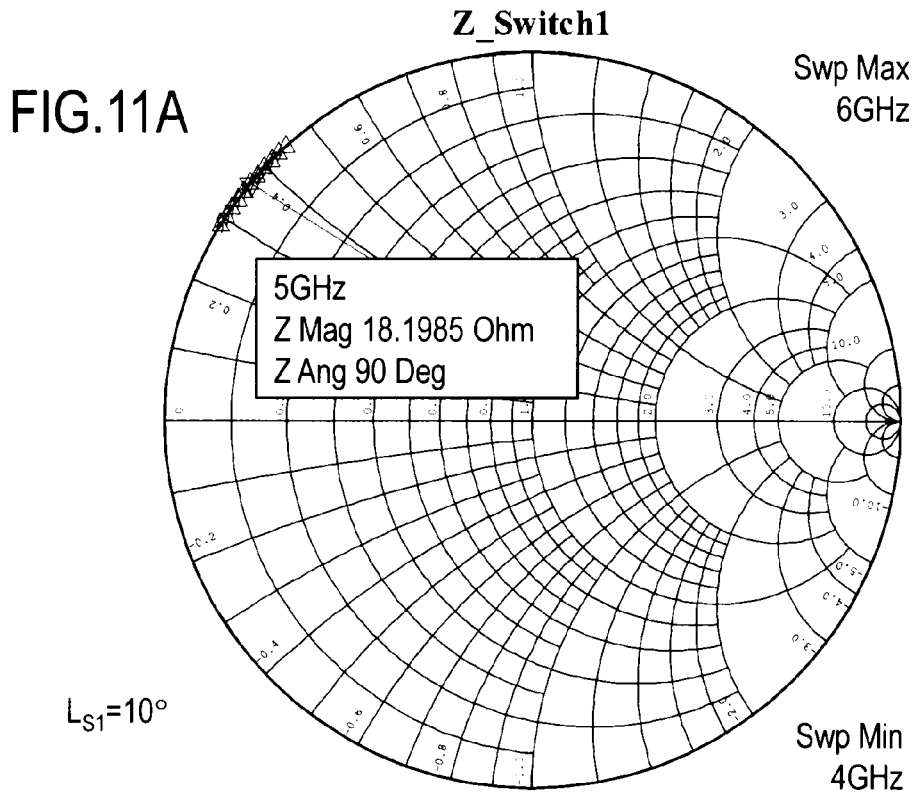
FIG. 11A is a diagram illustrating impedance $Z_{ins1}$ between 4 and 6 GHz when $L_{S1}$ is set at 10°.
Figure 11B:
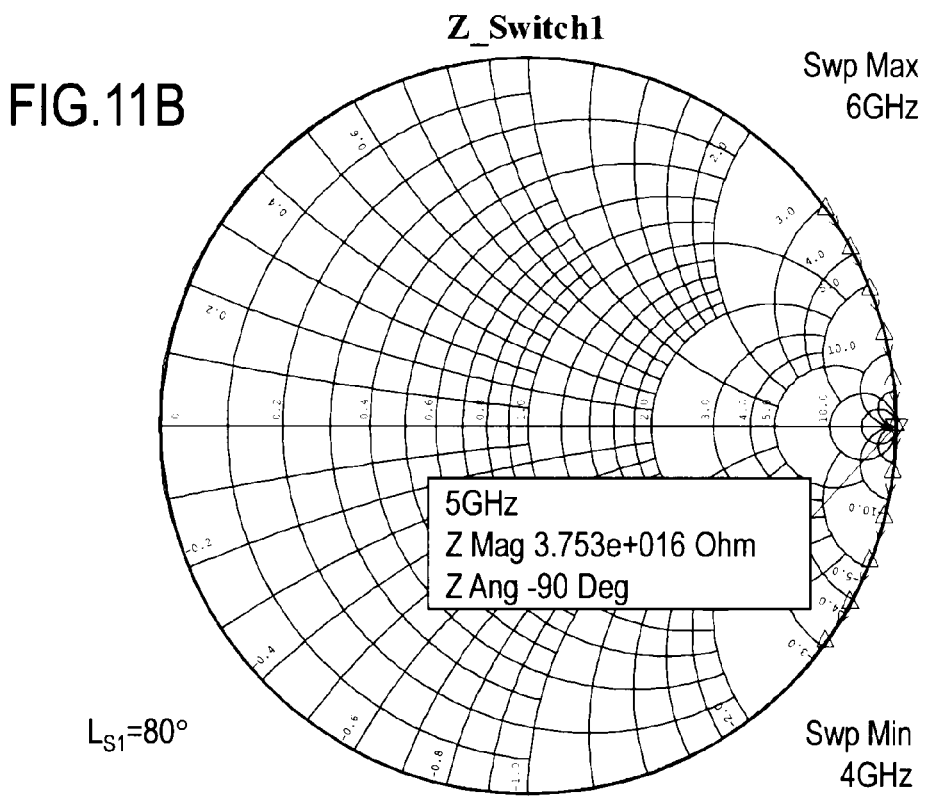
FIG. 11B is a diagram illustrating impedance $Z_{ins1}$ between 4 and 6 GHz when $L_{S1}$ is set at 80°.
Figure 12:
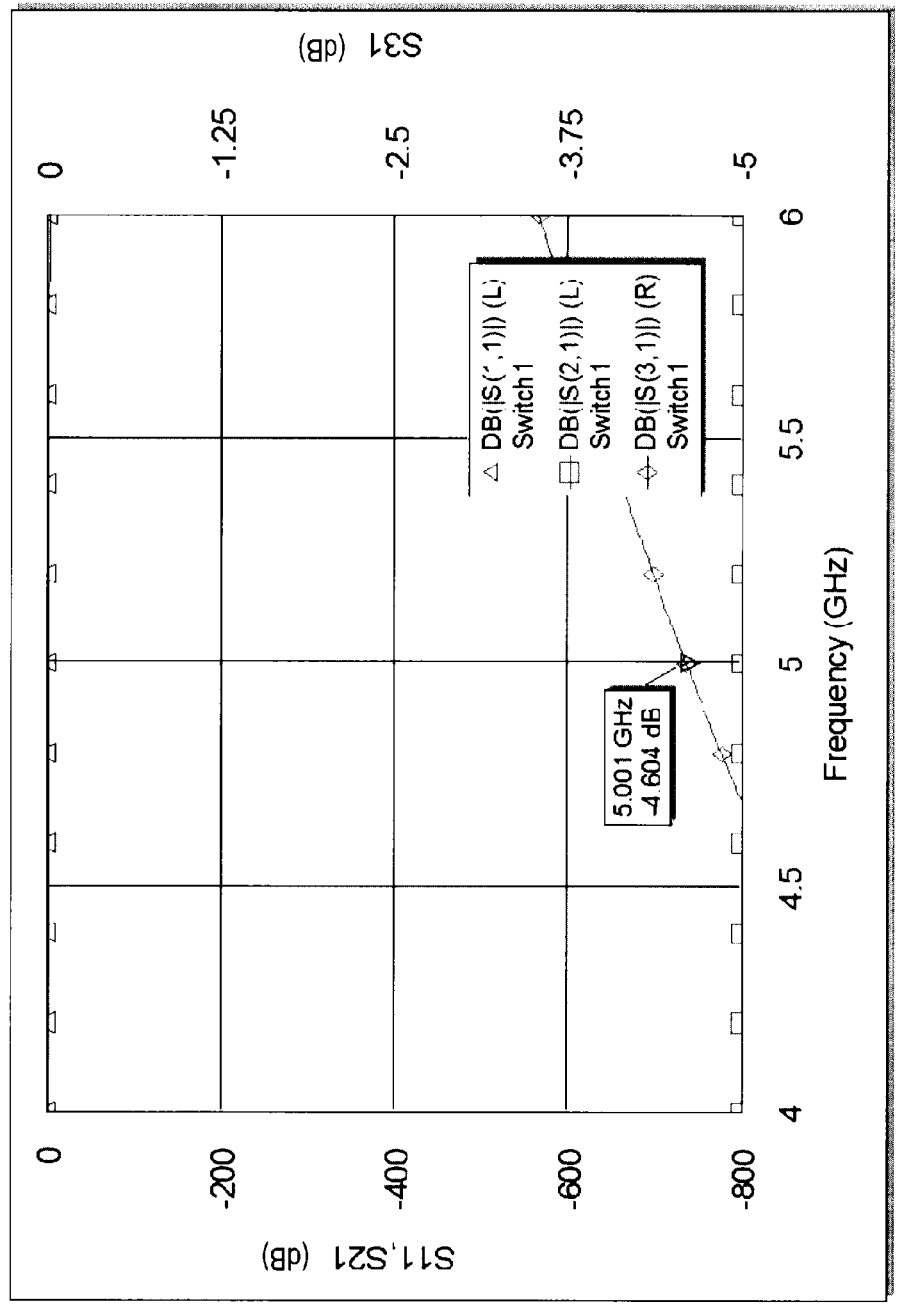
FIG. 12 is a diagram illustrating an S-parameter when $L_{S1}$ is set at 10°.
Figure 13:
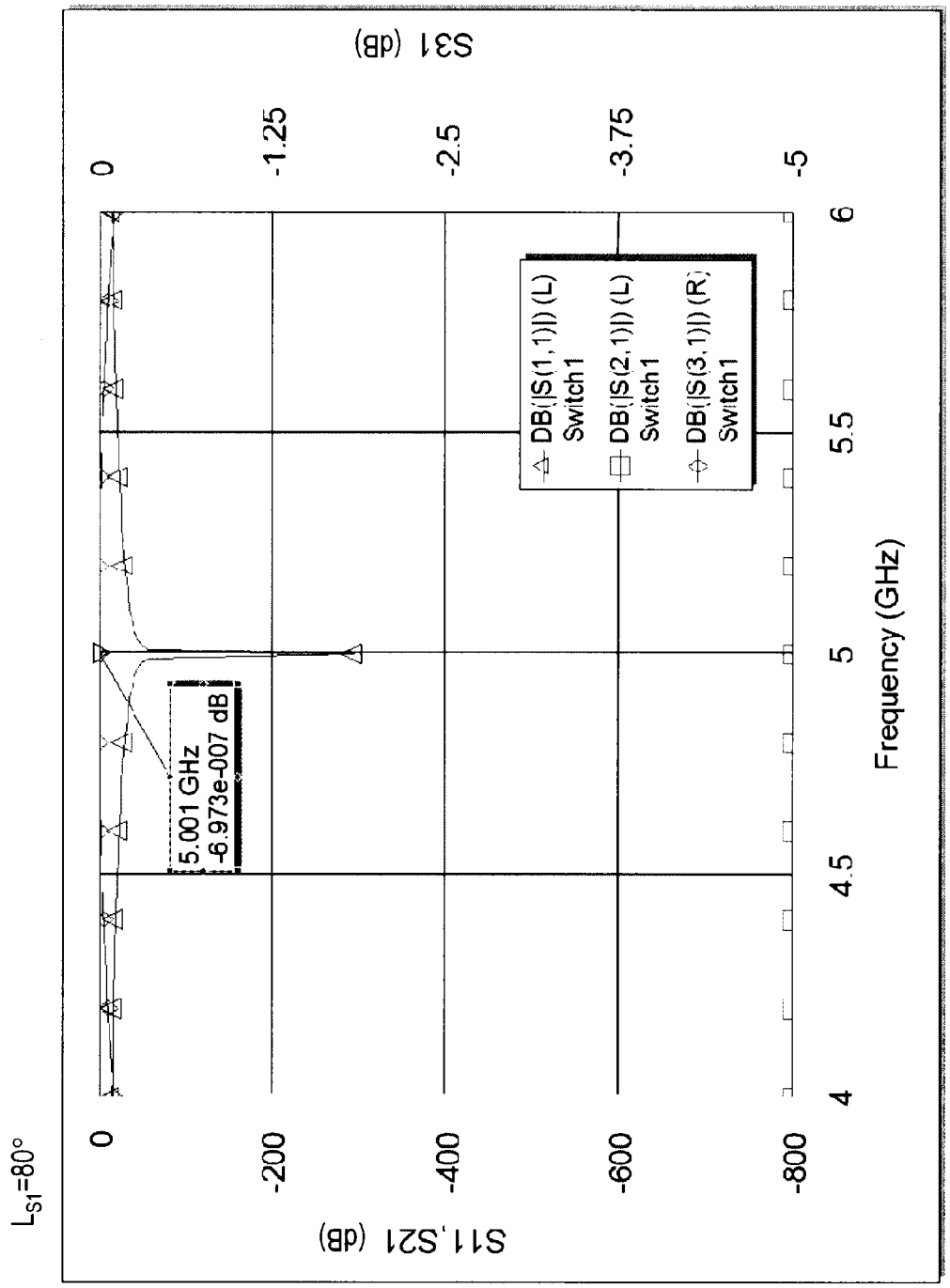
FIG. 13 is a diagram illustrating an S-parameter when $L_{S1}$ is set at 80°.

When signal propagation in the transmission path 1109 is to be blocked, switches 1111-*n* and 1131-*m* on the parallel lines at the same distance from an edge are turned on. This operation will be described with reference to a calculation model in FIG. 10. Factors such as the lengths of lines are the same as those in FIG. 5 and termination circuits 1112 and 1132 are ground conductors as in FIG. 5. A difference from the model in FIG. 5 is that the termination switch circuits in the on state are at a distance $L_{S1}$ on two transmission lines 1101 and 1102 making up a transmission line 1100 of a first transmission path 1109. Because of the presence of the on-state termination switch circuits, the impedance between the transmission lines 1101 and 1102 will be 0 at the distance $L_{S1}$. Thus, the same impedance that can be achieved using the short-circuiting switch 1120-*m* in FIG. 5 can be achieved. Therefore, the switching operation as in the configuration in FIG. 5 can be achieved in the configuration in FIG. 10 as well. FIGS. 11A, 11B, 12 and 13 illustrate impedance $Z_{ins1}$ and S-parameter at $L_{S1}$ of 10° and 80° in the configuration of FIG. 10 when the transmission path 1109 is viewed from the intersection 1010 of the transmission paths 1109 and 1209. FIG. 11A illustrates impedance $Z_{ins1}$ at frequencies between 4 and 6 GHz at $L_{S1}$ of 10°. FIG. 11B illustrates impedance $Z_{ins1}$ at frequencies between 4 and 6 GHz at $L_{S1}$ of 80°. FIG. 12 illustrates the S-parameter at $L_{S1}$ of 10°. FIG. 13 illustrates the S-parameter at $L_{S1}$ of 80°. In FIGS. 12 and 13, S11 represents the reflection coefficient of a signal input through the first port 1001 (the line with triangular marks), S21 represents the transmission coefficient from the first port 1001 to the second port 1002 (the line with square marks), and S31 represents the transmission coefficient from the first port 1001 to the third port 1003 (the line with rhombic marks). It can be seen from FIGS. 11A, 11B, 12 and 13 that the same characteristics as in FIG. 6A, 6B, 7 and 8 can be achieved. Thus, the switching operation as in the configuration in FIG. 4 can be accomplished in the configuration in FIG. 9. In the variation, as in the configuration in FIG. 4, short-circuiting switches 1120-1, ..., 1120-M and 1220-1, ..., 1220-M may be provided and selectively used for an intended function.

Implementation of Filtering

Figure 14:
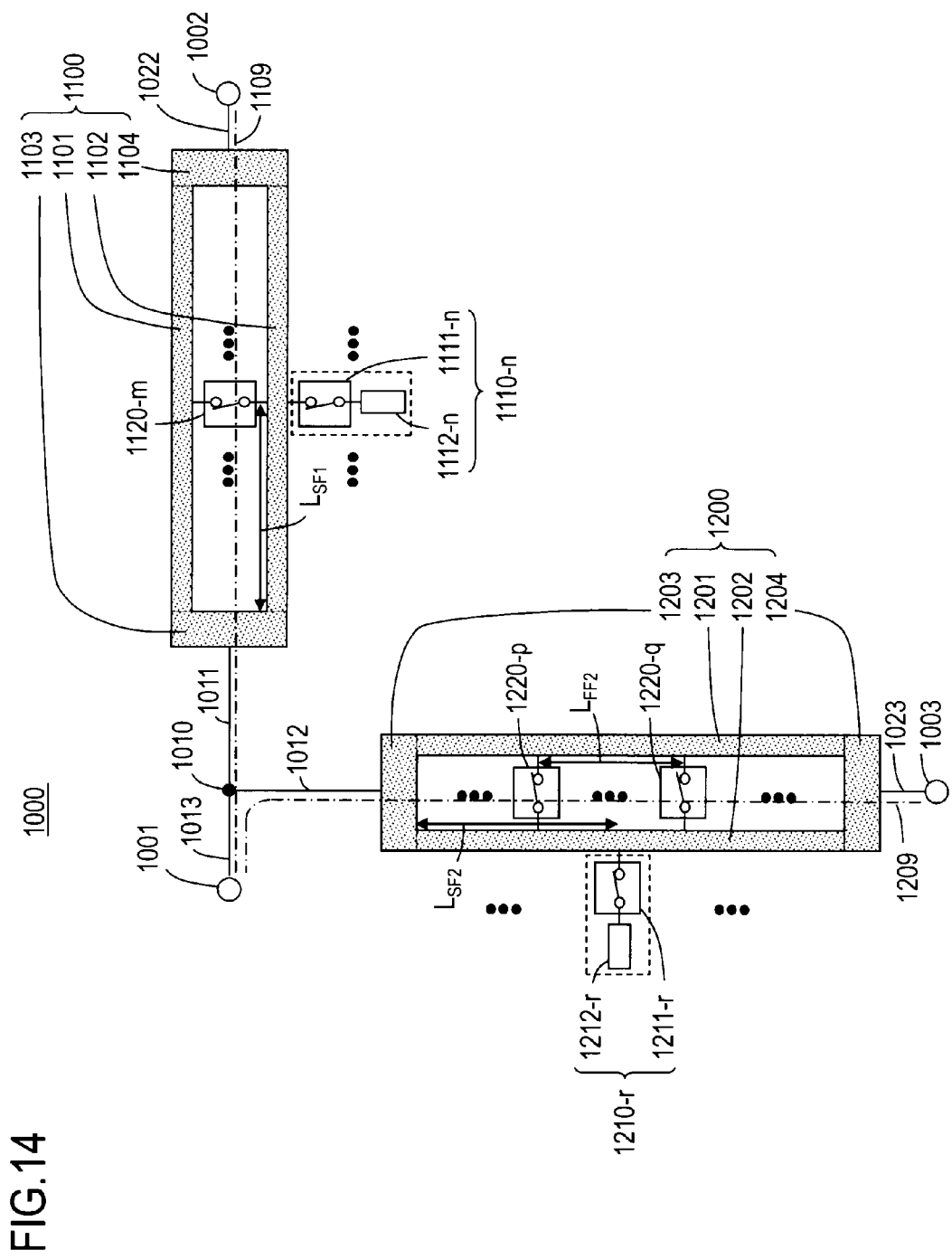
FIG. 14 is a diagram illustrating a multimode frontend circuit of the present invention functioning as a filter.

A function of the multimode frontend circuit of the first embodiment will be described with respect to the circuit configuration in FIG. 14. In the transmission line 1200 of the transmission path 1209 in FIG. 14, switches 1211-*r*, 1220-*p* and 1220-*q* are in the on state, unlike in FIGS. 5 and 10. The location of the switch 1211-*r* is represented by $L_{SF2}$ and the distance between the switches 1220-*p* and 1220-*q* is represented by $L_{FF2}$. While all switches of the transmission path 1209 are turned off to cause the transmission path 1209 to function as merely a transmission path in FIGS. 5 and 10, the transmission path 1209 in FIG. 14 can be caused to function as a filter by appropriately turning on the switches 1211-*r*, 1220-*p* and 1220-*q*. The operation will be described with reference to FIG. 15.

Figure 15:
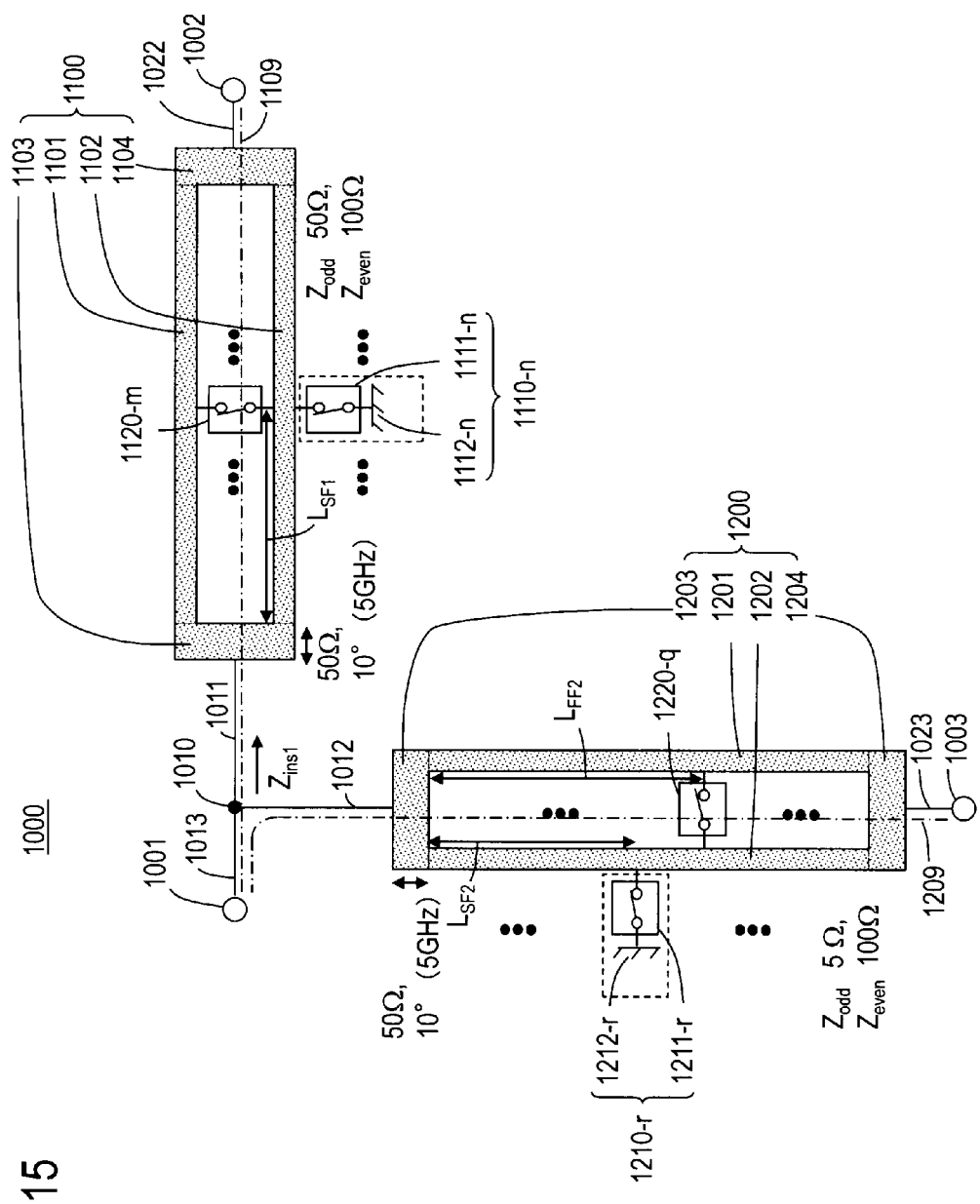
FIG. 15 illustrates a circuit model of the multimode frontend circuit of the present invention functioning as a filter.

Like FIG. 5, FIG. 15 illustrates a circuit model used for calculating characteristics of the circuit. As before, it is assumed here that signal propagation in the transmission path 1109 is to be blocked and signal propagation in the transmission path 1209 is to be allowed. Termination circuits 1112-*n* and 1212-*r* are ground conductors. Frequency to be passed or blocked can be switched between 5 GHz and 4.5 GHz, for example, and the bandwidth of the transmission path 1209 is also variable. The circuit model for 5 GHz will be described first. The transmission path 1109 is the same as that in FIGS. 6A, 6B, 7 and 8 and therefore description of the transmission path 1109 will be omitted. The location of switch 1211-*r* is represented by $L_{SF2}$ and the location of switch 1220-*q* is represented by $L_{FF2}$ for the transmission path 1209. Switch 1220-*p* is not used in the model in FIG. 15. In this case, the connection point (location 0) between an input/output line 1203 and each of transmission lines 1201 and 1202 can be considered to be the location of the switch 1220-*p* and therefore the location of switch 1220-*q* is represented by $L_{FF2}$. The center frequency of the filter is determined by $L_{FF2}$. When $L_{FF2}$ is 180°, the center frequency is 5 GHz. The bandwidth is determined by $L_{SF2}$. Changing the value of $L_{SF2}$ changes the bandwidth but does not change the center frequency. That is, the center frequency and the bandwidth can be changed independently of each other. This is one of the features of the first embodiment. The filter is detailed in the unpublished patent application (Japanese Patent Application No. 2010-049126) filed by the present applicant and therefore description thereof will be omitted.

Figure 16:
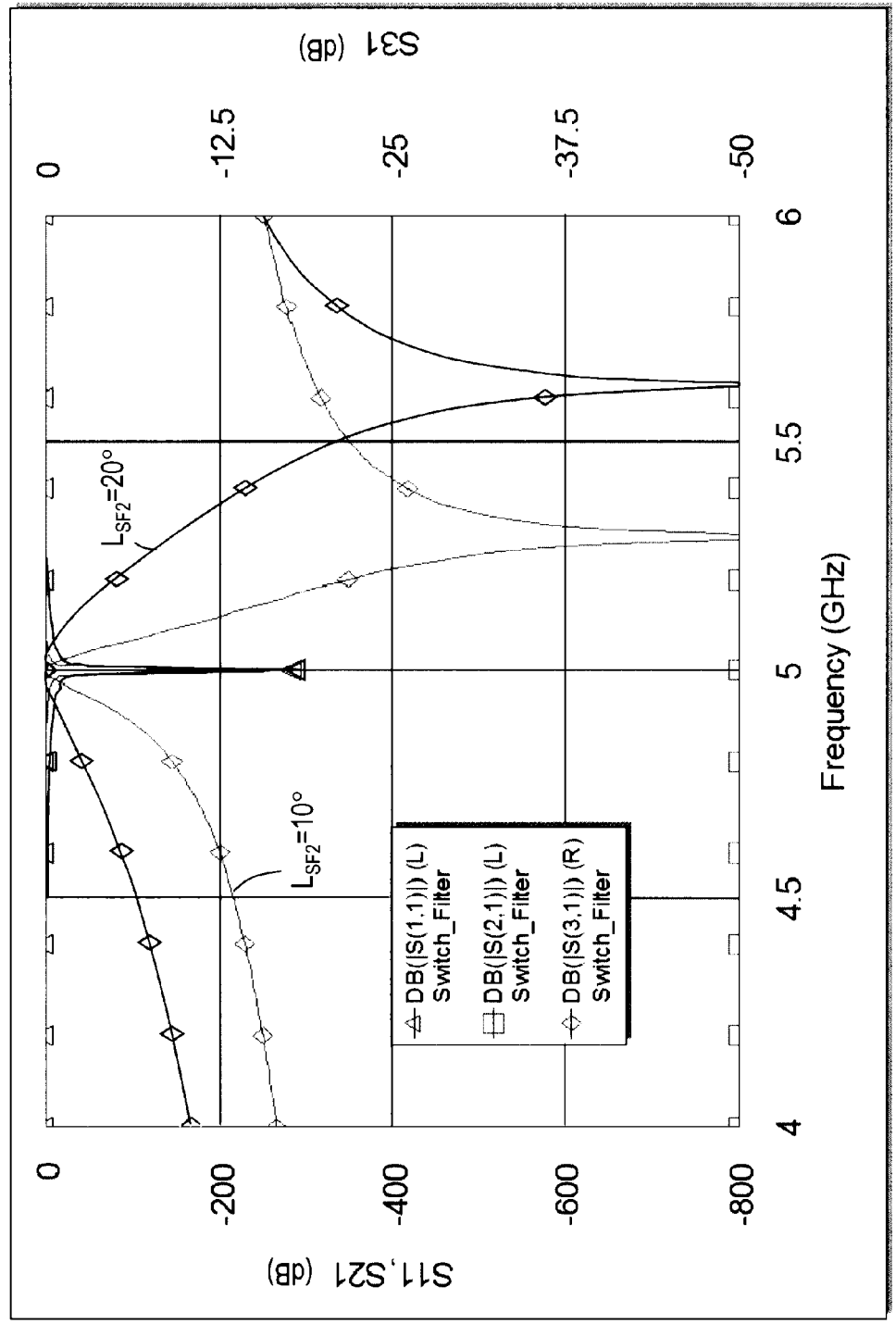
FIG. 16 is a diagram illustrating frequency characteristics of the multimode frontend circuit of the present invention functioning as a filter when $L_{SF1}$=80°, $L_{FF2}$=180° and $L_{SF2}$ is changed between 10° and 20°.

FIG. 16 illustrates frequency characteristics when $L_{SF1}=80°$, $L_{FF2}=180°$, and $L_{SF2}$ is changed between 10° and 20°. In FIG. 16, S11 represents the reflection coefficient of a signal input through the first port 1001 (the line with triangular marks), S21 represents the transmission coefficient from the first port 1001 to the second port 1002 (the line with square marks), and S31 represents the transmission coefficient from the first port 1001 to the third port 1003 (the line with rhombic marks). Signal propagation in the transmission path 1109 is blocked as S21 is −800 dB. As can be seen, the transmission path 1209 has characteristics of a filter with a center frequency of 5 GHz, showing that the bandwidth can be changed by changing the value of $L_{SF2}$ without changing the center frequency.

Figure 17:
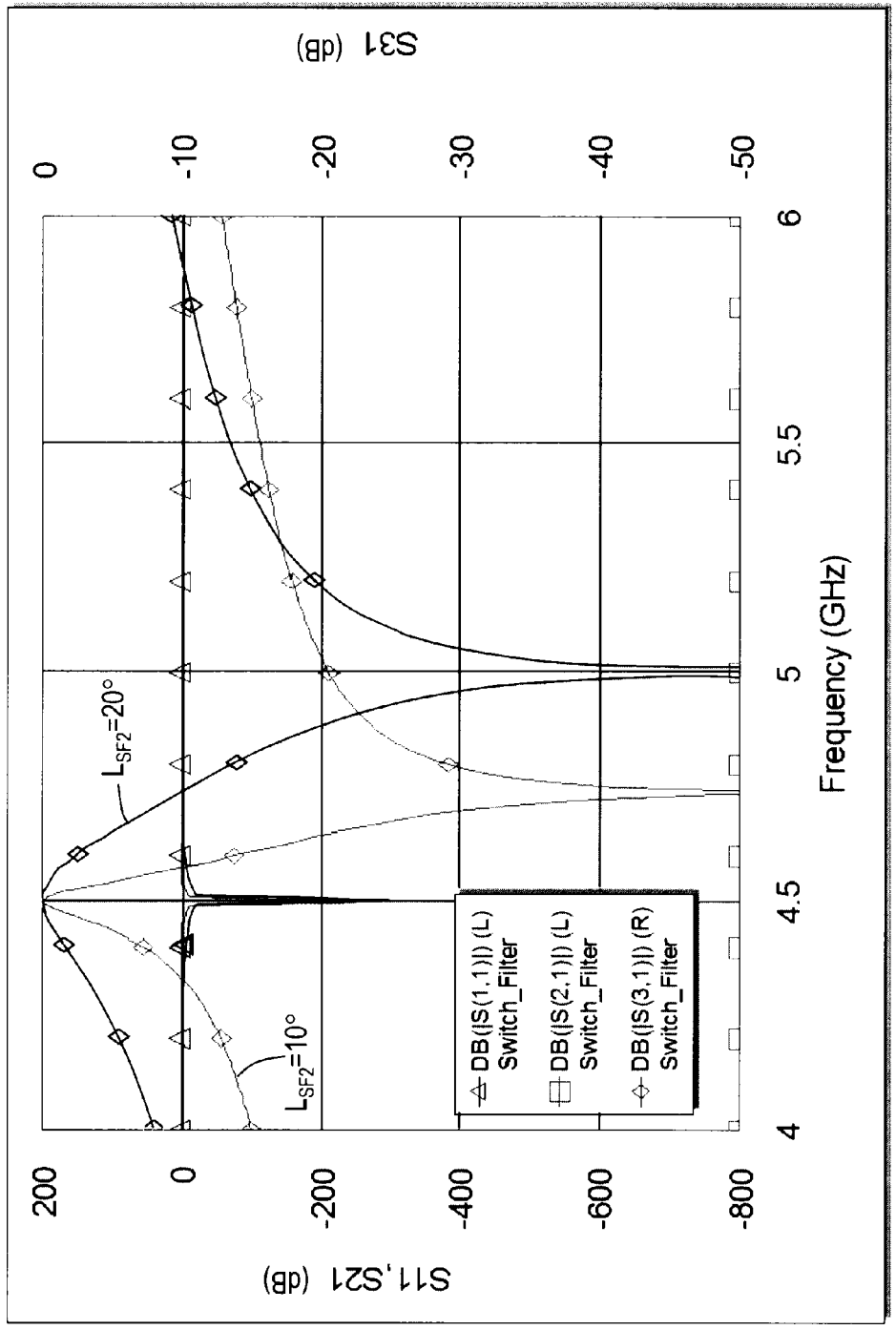
FIG. 17 is a diagram illustrating frequency characteristics of the multimode frontend circuit of the present invention functioning as a filter when $L_{SF1}$ is 90°, $L_{FF2}$=200° and $L_{SF2}$ is changed between 10° and 20°.

The circuit model for 4.5 Hz will be described next. In the transmission path 1109, $L_{SF1}$ in FIG. 15 is changed to 90° so that $Z_{ins1}$ becomes infinite at 4.5 GHz. In the transmission path 1209, $L_{FF2}$ is set to 200° to change the center frequency of the filter to 4.5 GHz. As before, the bandwidth can be changed by $L_{SF2}$ while the center frequency is kept constant. FIG. 17 illustrates frequency characteristics when $L_{SF1}$=90° and $L_{FF2}$=200°, and $L_{SF2}$ is changed between 10° and 20°. It can be seen from FIG. 17 that the transmission path 1109 has characteristics that block a signal with 4.5 GHz while the characteristics of the transmission path 1209 shows that it is functioning as a filter with a center frequency of 4.5 Hz. It also can be seen that the bandwidth of the transmission path 1209 can be changed independently of the center frequency by changing $L_{SF2}$.

While the filtering characteristics of the transmission path 1209 as a one-stage filter using a single resonator has been described, filtering characteristics of the transmission path 1209 as a filter with two or more stages can be adjusted as well by appropriately turning on switches 1211-*r*, 1220-*p* and 1220-*q*. This is detailed in the patent application given above (Japanese Patent Application No. 2010-049126) and therefore description of such filtering will be omitted.

Implementation of Duplex Function

Figure 18:
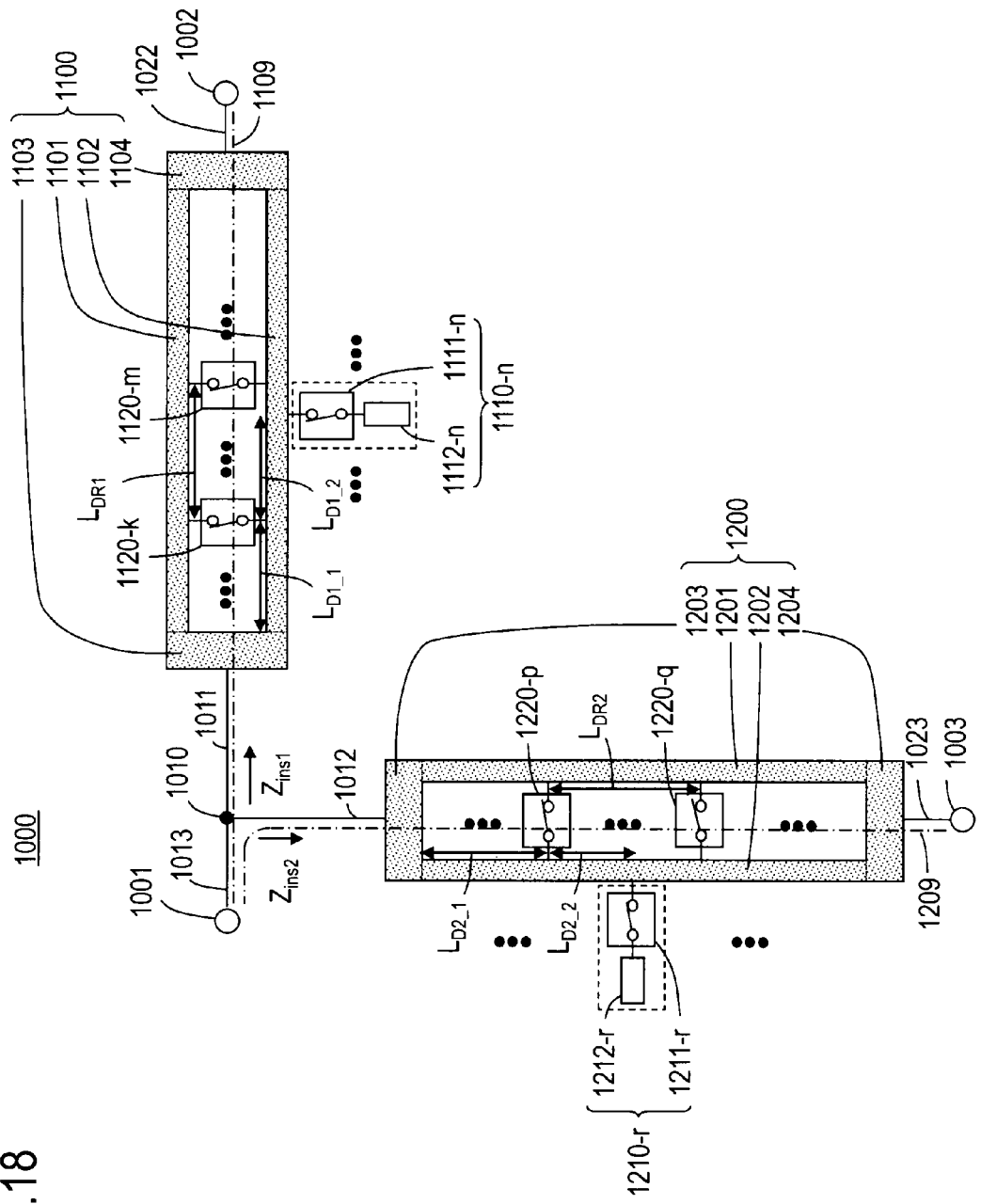
FIG. 18 is a diagram illustrating an exemplary states of switches of the multimode frontend circuit of the present invention when used as a duplexer.

A multimode frontend circuit of the first embodiment used as a duplexer will be described below. FIG. 18 illustrates exemplary states of switches when the multimode frontend circuit of the first embodiment is used as a duplexer. The switches are set so that both transmission paths 1109 and 1209 function as the filter described above. Each transmission path has two short-circuiting switches 1120-*k* and 1120-*m* (1220-*p* and 1220-*q*) in the on state, and one switch 1111-*n* (1211-*r*) in the on state in the segment enclosed by the two short-circuiting switches and parallel lines. The segment between the two short-circuiting switches 1120-*k* and 1120-*m* (1220-*p* and 1220-*q*) functions as a resonator, which allows the transmission path to function as a filter. Here, the distances from the starting points of transmission lines 1101, 1102 and 1201, 1202 (the edges connected to input/output lines 1103 and 1203, respectively) to the on-state short-circuiting switches 1120-*k* and 1220-*p*, respectively, closest to the starting points are $L_{D1\_1}$ and $L_{D2\_1}$, respectively, in the transmission paths 1109 and 1209, respectively. The distances from the short-circuiting switches 1120-*k* and 1220-*p* closest to the starting points to the switches 1111-*n* and 1211-*r*, respectively, in the on state are $L_{D1\_2}$ and $L_{D2\_2}$, respectively, in the transmission paths 1109 and 1209, respectively. The lengths of the segments of transmission lines 1100 and 1200 that function as resonators with the two short-circuiting switches 1120-*k* and 1120-*m*, 1220-*p* and 1220-*q* in the on state are $L_{DR1}$ and $L_{DR2}$, respectively, in the transmission paths 1109 and 1209.

The center frequency is determined by the length $L_{DR1}$ ($L_{DR2}$) of the segment, which can be changed using the short-circuiting switches 1120-*k* and 1120-*m* (1220-*p* and 1220-*q*). The bandwidth can be set by the switch 1111-*n* (1211-*r*) independently of the center frequency. A remarkable feature of the multimode frontend circuit used as a duplexer is that frequencies to be blocked can be changed while maintaining the center frequencies that are allowed to pass. Specifically, the starting point of the segment that is caused to function as a resonator is changed. For example, if the center frequency of the transmission path 1109 is $f_1$ and the center frequency of the transmission path 1209 is $f_2$, the location $L_{D1\_1}$ of the short-circuiting switch 1120-*k*, which is the starting point of the segment of the transmission path 1109 functioning as a resonator, is adjusted so that $Z_{ins1}$ peaks at frequency $f_2$. Similarly, the location $L_{D2\_1}$ of the short-circuiting switch 1220-*p*, which is the starting point of the segment of the transmission path 1209 functioning as a resonator, is adjusted so that the impedance $Z_{ins2}$ when the third port 1003 is viewed from the intersection 1010 of the two transmission paths peaks at frequency $f_1$. Such adjustments enable the transmission path 1109 to efficiently pass a signal with the frequency $f_1$ and to efficiently block a signal with frequency $f_2$ (to direct the signal to the transmission path 1209). Similarly, the adjustments enable the transmission path 1209 to efficiently pass the signal with frequency $f_2$ and to efficiently block the signal with frequency $f_1$ (to direct the signal to the transmission path 1109).

Figure 19:
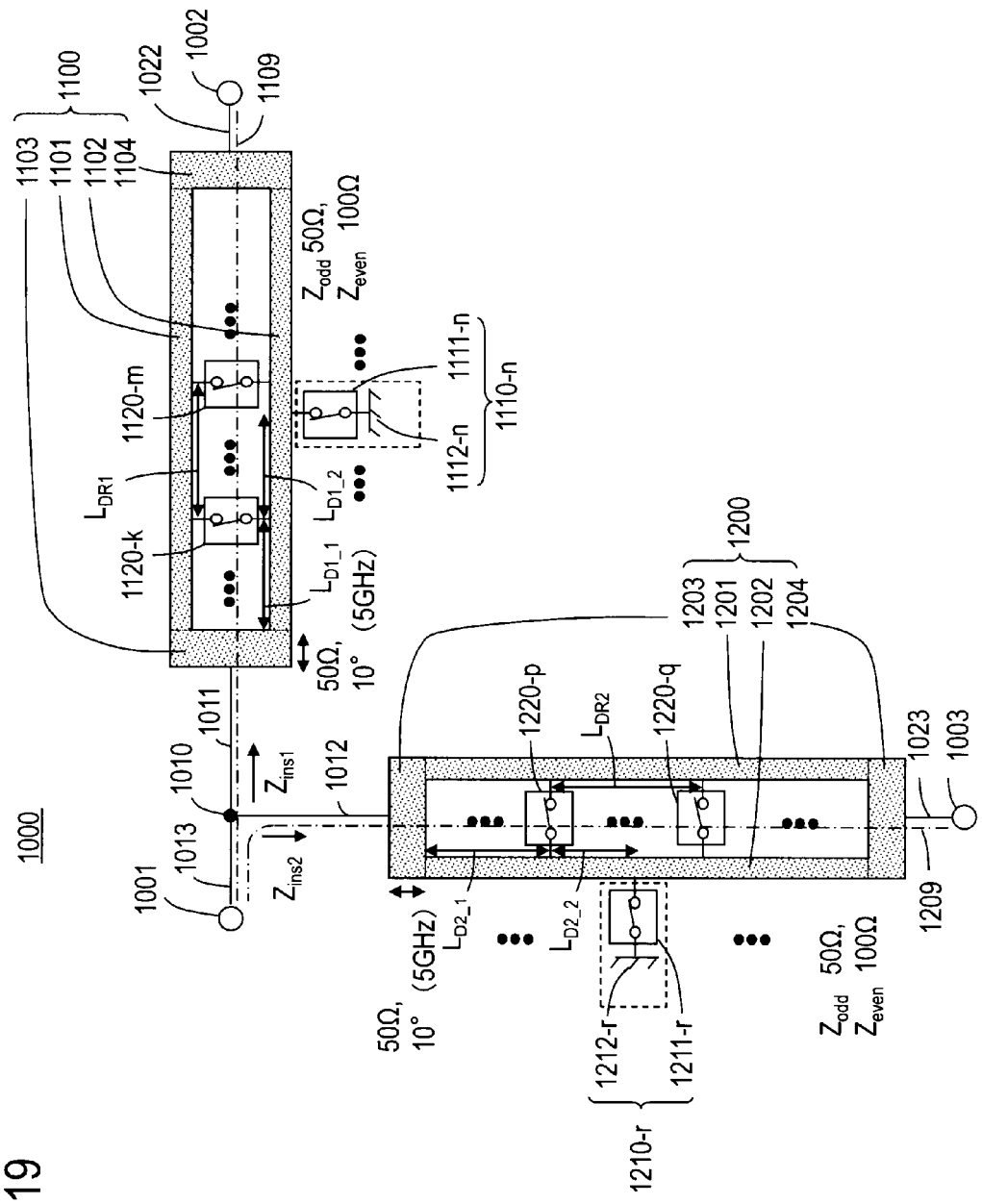
FIG. 19 illustrates a circuit mode of the multimode frontend circuit of the present invention functioning as a duplexer.
Figure 20:
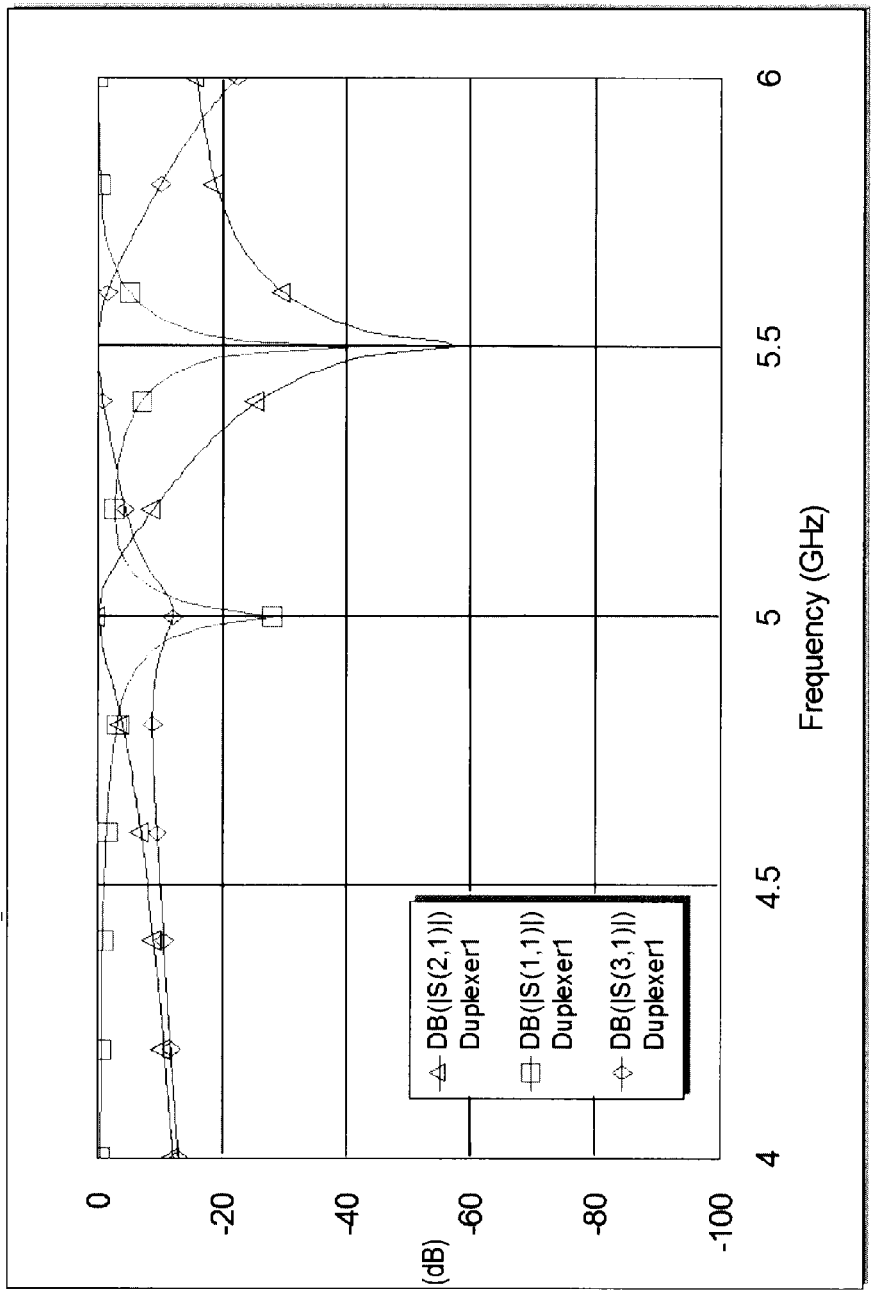
FIG. 20 is a diagram illustrating frequency characteristics of the multimode frontend circuit of the present invention functioning as a duplexer when $L_{DR1}$=180°, $L_{D1\_1}$=55°, $L_{D1\_2}$=17°, $L_{DR2}$=164°, $L_{D2\_1}$=52° and $L_{D2\_2}$=17°.
Figure 21:
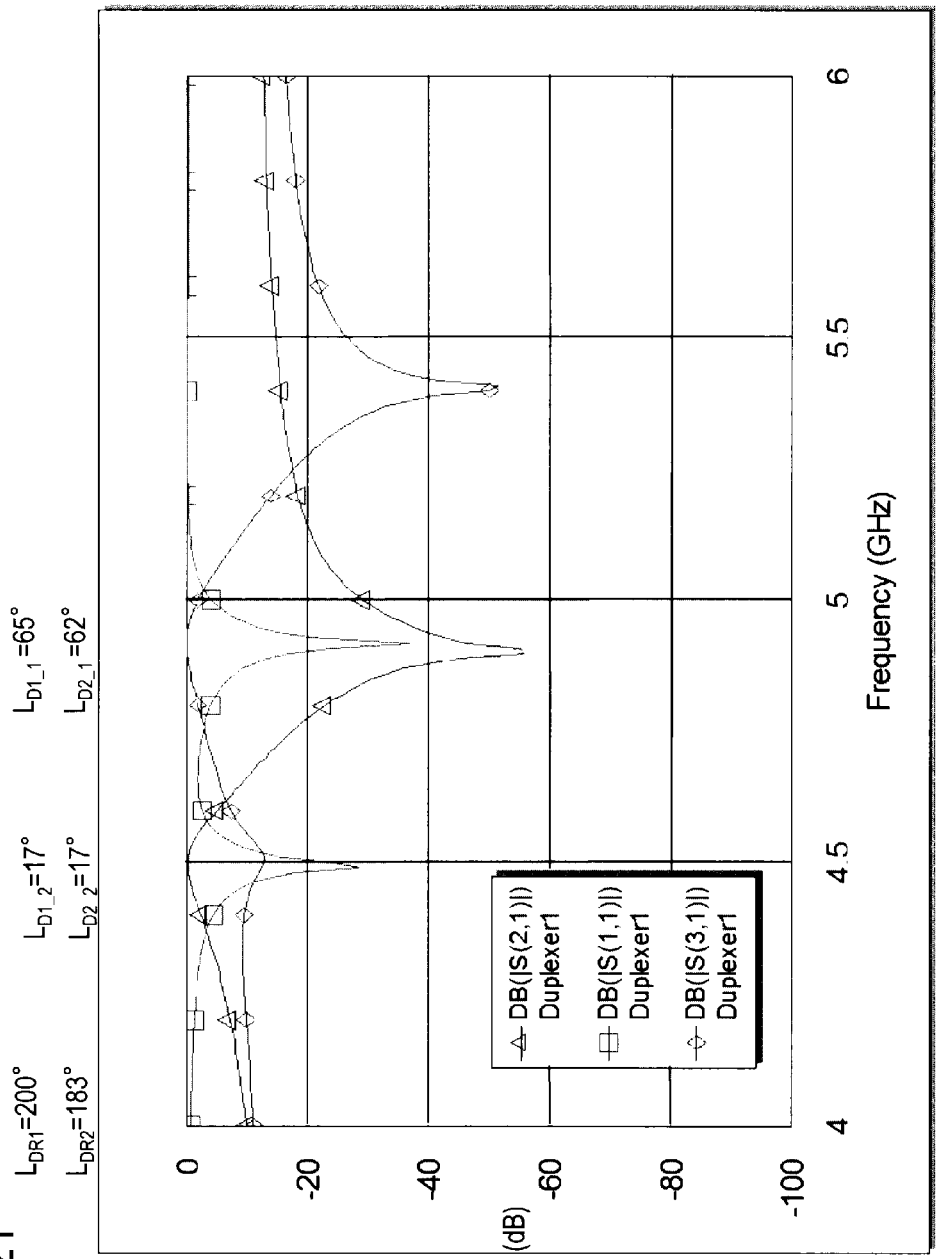
FIG. 21 is a diagram illustrating frequency characteristics of the multimode frontend circuit of the present invention functioning as a duplexer when $L_{DR1}$=200°, $L_{D1\_1}$=65°, $L_{D1\_2}$=17°, $L_{DR2}$=183°, $L_{D2\_1}$=62° and $L_{D2\_2}$=17°.

The operation will be described with respect to a circuit model in FIG. 19 and frequency characteristics in FIGS. 20 and 21. FIG. 19 is a circuit model of the multimode frontend circuit of the first embodiment functioning as a duplexer. Termination circuits 1112-*n* and 1212-*n* are ground conductors. FIG. 20 illustrates frequency characteristics when $L_{DR1}$=180°, $L_{D1\_1}$=55°, $L_{D1\_2}$=17°, $L_{DR2}$=164°, $L_{D2\_1}$=52°, and $L_{D2\_2}$=17°. FIG. 21 illustrates frequency characteristics when $L_{DR1}$=200°, $L_{D1\_1}$=65°, $L_{D1\_2}$=17°, $L_{DR2}$=183°, $L_{D2\_1}$=62°, and $L_{D2\_2}$=17°. Changing the parameters that determine the locations of the switches in the on state enables the multimode frontend circuit to function as a duplexer capable of operating with variable frequency characteristics. In FIGS. 20 and 21, S11 represents the reflection coefficient of a signal input through the first port 1001 (the line with triangular marks), S21 represents the transmission coefficient from the first port 1001 to the second port 1002 (the line with square marks), and S31 represents the transmission coefficient from the first port 1001 to the third port 1003 (the line with rhombic marks). It can be seen from FIG. 20 that the passband of the transmission path 1109 is 5 GHz and the passband of the transmission path 1209 is 5.5 GHz. Also, it can be seen from FIG. 21 that the passband of the transmission path 1109 is 4.5 GHz and the passband of the transmission path 1209 is approximately 4.8 GHz.

Selecting appropriately the switches 1120-1, . . . , 1120-M and 1111-1, . . . , 1111-N (1220-1, . . . , 1220-M and 1211-1, . . . , 1211-N) to turn on as described above enables the multimode frontend circuit of the first embodiment to function as a switch at times, as a switch having a filtering function at other times, and as a duplexer at yet other times. Furthermore, the center frequencies and bandwidths of the filter and the duplexer can be changed independently of each other and the number of stages of the filter and the duplexer can also be changed.

Figures 22A, 22B, 22C, 22D, 22E, 22F, 22G:
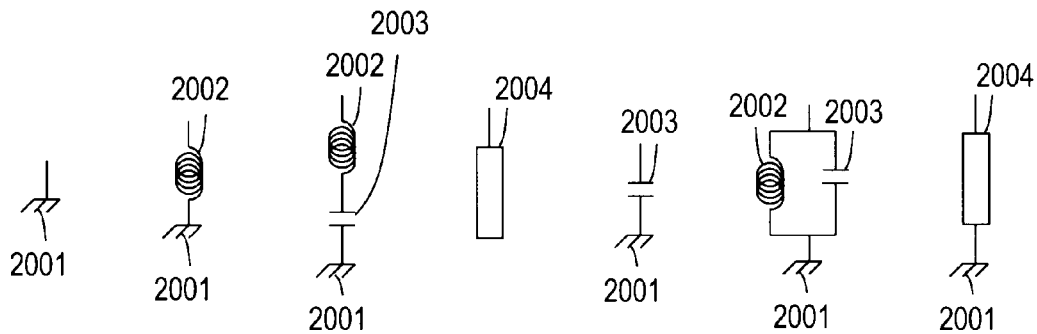
FIG. 22A is a diagram illustrating an example of a termination circuit directly grounded.
FIG. 22B is a diagram illustrating an example of a termination circuit grounded through an inductor.
FIG. 22C is a diagram illustrating an example of a termination circuit grounded through an inductor and a capacitor connected in series.
FIG. 22D is a diagram illustrating an example of a termination circuit using an open transmission line.
FIG. 22E is a diagram illustrating an example of a termination circuit grounded through a capacitor.
FIG. 22F is a diagram illustrating an example of a termination circuit grounded through an inductor and a capacitor connected in parallel.
FIG. 22G is a diagram illustrating a termination circuit grounded through a transmission line.
Figures 22H, 22I, 22J, 22K, 22L, 22M:
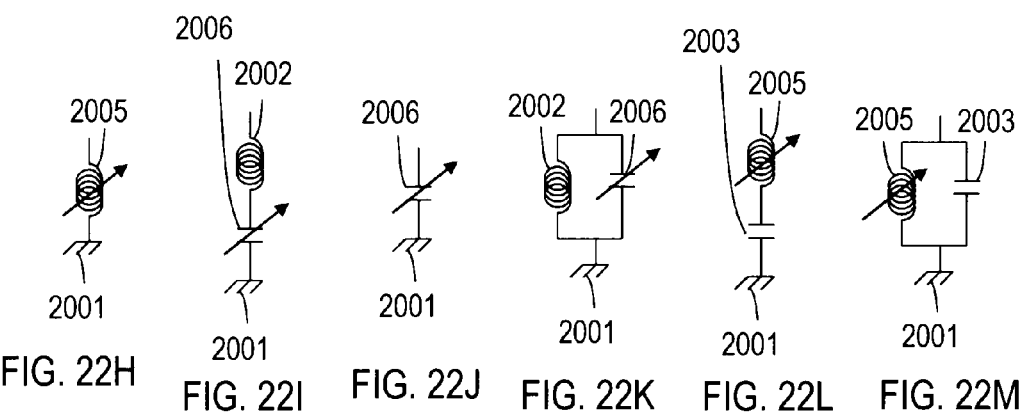
FIG. 22H is a diagram illustrating an example of a termination circuit grounded through a variable inductor.
FIG. 22I is a diagram illustrating an example of a termination circuit grounded through an inductor and a variable capacitor connected in series.
FIG. 22J is a diagram illustrating an example of a termination circuit grounded through a variable capacitor.
FIG. 22K is a diagram illustrating an example of a termination circuit grounded through an inductor and a variable capacitor connected in parallel.
FIG. 22L is a diagram illustrating an example of a termination circuit grounded through a variable inductor and a capacitor connected in series.
FIG. 22M is a diagram illustrating an example of a termination circuit grounded through a variable inductor and a capacitor connected in parallel.
Figures 22N, 22O, 22P, 22Q:
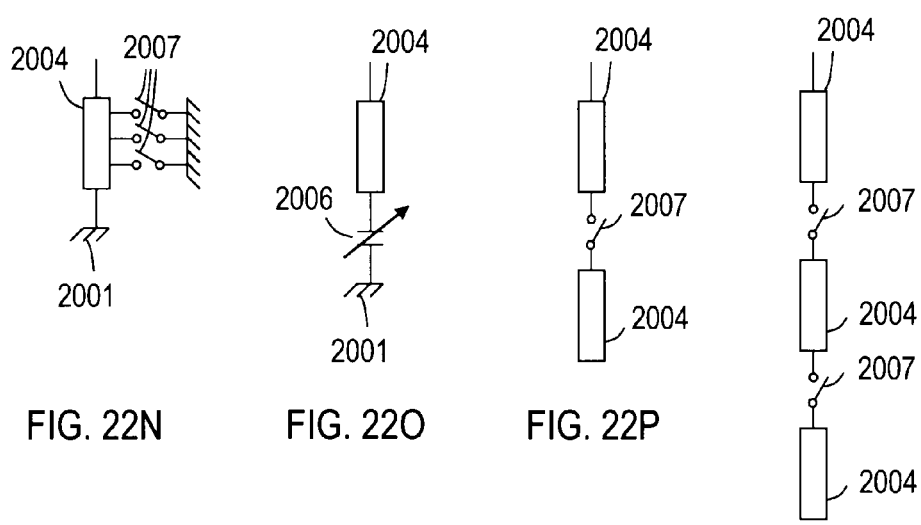
FIG. 22N is a diagram illustrating an example of a termination circuit grounded through a transmission line that can be changed in length through a switch provided on the transmission line.
FIG. 22O is a diagram illustrating an example of a termination circuit grounded through a transmission line and a variable capacitor connected in series.
FIG. 22P is a diagram illustrating an example of a termination circuit in which two transmission lines are connected in series through a switch.
FIG. 22Q is a diagram illustrating an example of a termination circuit in which three transmission lines are connected in series through switches.

The characteristics of the multimode frontend circuit having termination circuits 1112-*n* and 1212-*n* that are ground conductors have been described above. However, the termination circuits 1112-*n* and 1212-*n* are not limited to ground conductors; various circuits illustrated in FIGS. 22A to 22Q can be connected. Furthermore, the circuits are not limited to fixed-characteristics circuits. By connecting variable-characteristics circuits, characteristics can be changed more flexibly. FIGS. 22A to 22Q illustrate exemplary combinations with a ground conductor 2001, a coil 2002, a capacitor 2003, a transmission line 2004, a variable coil 2005, a variable capacitor 2006, and a switch 2007. However, combinations are not limited to these.

Figure 23:
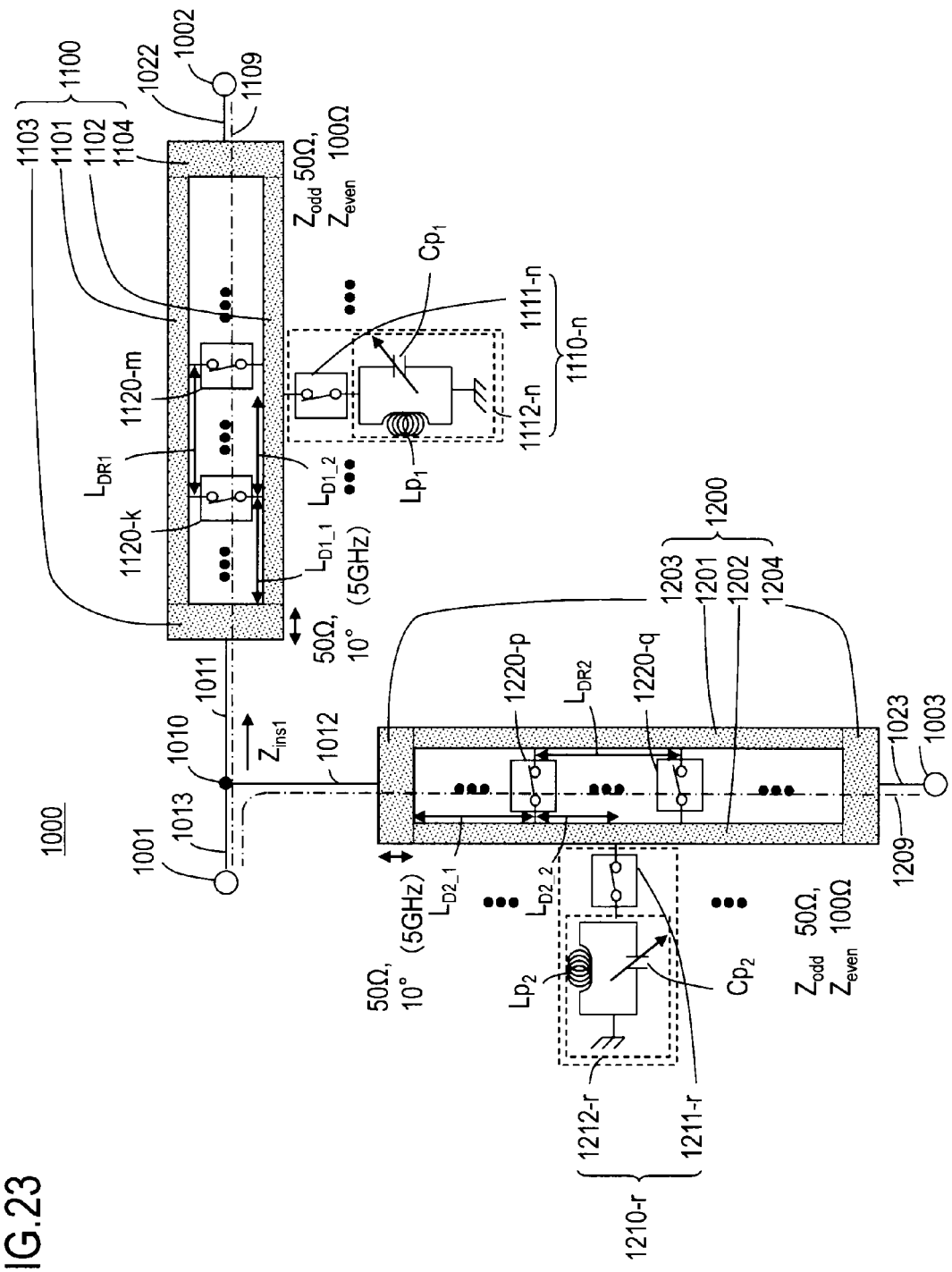
FIG. 23 is a diagram illustrating a configuration of a multimode frontend circuit of the present invention using a variable LC resonator as a termination circuit.
Figure 24:
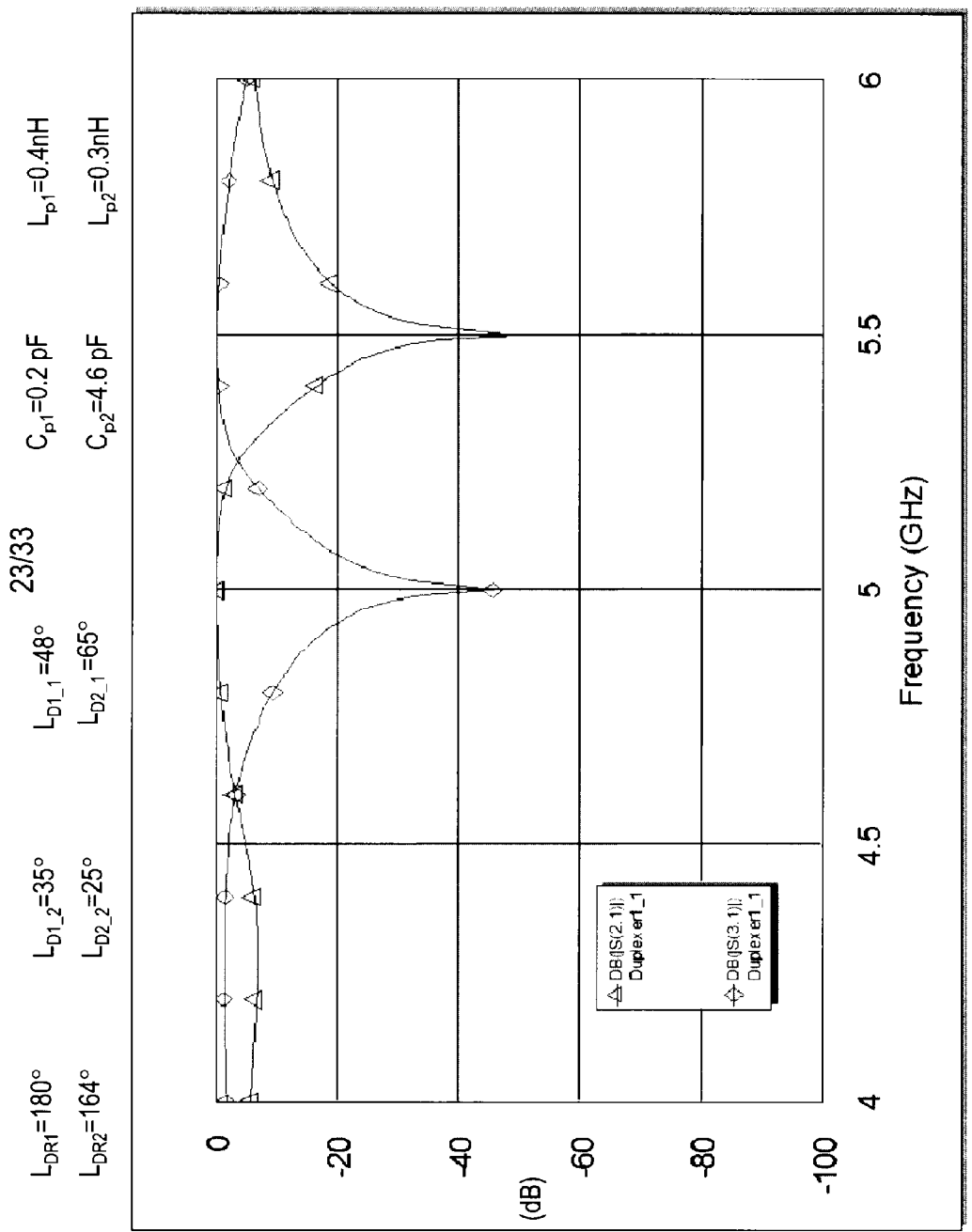
FIG. 24 is a diagram illustrating frequency characteristics of the multimode frontend circuit in FIG. 23 functioning as a duplexer when $L_{DR1}$=180°, $L_{D1\_1}$=48°, $L_{D1\_2}$=35°, $L_{DR2}$=164°, $L_{D2\_1}$=65°, $L_{D2\_2}$=25°, $C_{P1}$=0.2 pF, $L_{P1}$=0.4 nH, $C_{P2}$=4.6 pF, and $L_{P2}$=0.3 nH.

FIG. 23 illustrates an exemplary configuration using variable LC resonators as termination circuits 1112-$n$ and 1212-$r$. The inductances of the coils of parallel resonators used as transmission paths 1109 and 1209 are represented by $L_{P1}$ and $L_{P2}$, respectively, and the capacitances of capacitors are presented by $C_{P1}$ and $C_{P2}$. By changing the characteristics of these reactance elements, the frequency characteristics of the transmission paths 1109 and 1209 can be changed while maintaining the center frequencies. FIG. 24 illustrates frequency characteristics when $L_{DR1}=180°$, $L_{D1\_1}=48°$, $L_{D1\_2}=35°$, $L_{DR2}=164°$, $L_{D2\_1}=65°$, $L_{D2\_2}=25°$, $C_{P1}=0.2$ pF, $L_{P1}=0.4$ nH, $C_{P2}=4.6$ pF, and $L_{P2}=0.3$ nH. The passband frequencies of the transmission paths 1109 and 1209 are 5 GHz and 5.5 GHz, respectively, which are the same as those in FIG. 20. It can be seen from FIG. 24 that the propagation factor of a signal propagating through the second transmission path 1209, in particular, significantly decreases from approximately −15 dB to more than −40 dB at 5 GHz, showing an improvement in the degree of signal separation.

The termination circuits 1112-$n$ and 1212-$n$ do not necessarily need to be of one type; they may be designed according to desired characteristics. While exemplary configurations using micro-strip lines have been described above, the present embodiment is not limited to configurations using micro-strip lines.

As has been described above, the multimode frontend circuit of the first embodiment can provide the functions of a switch, a switch with a filtering function, and a duplexer. Furthermore, frequency characteristics can be changed. In particular, the center frequencies and bandwidths of the multimode frontend circuit functioning as a filter or duplexer can be changed independently of each other. The number of stages of the filter and duplexer can also be changed. Moreover, the multimode frontend circuit of the first embodiment can be readily fabricated because the circuit can be configured with transmission lines, switches, reactance elements, variable reactance elements and the like.

Second Embodiment

Figure 25:
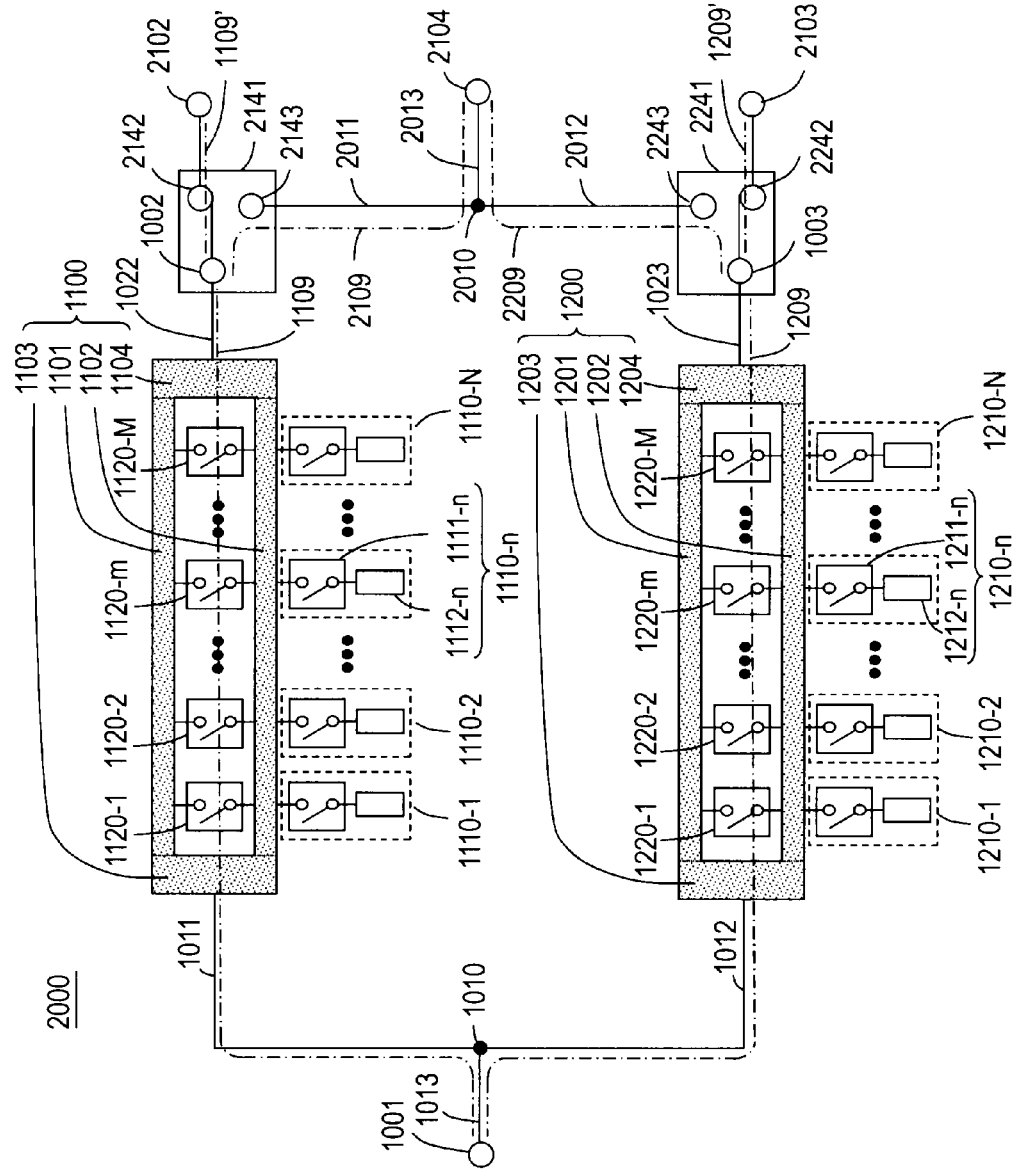
FIG. 25 is a diagram illustrating a configuration of a multimode frontend circuit of a second embodiment.

FIG. 25 illustrates a configuration of a multimode frontend circuit of a second embodiment. Like the multiband frontend circuit of the first embodiment, the multimode frontend circuit of the second embodiment may be fabricated with micro-strip lines, for example. Like the multimode frontend circuit 1000, the multimode frontend circuit 2000 comprises three ports, namely a first port 1001, a second port 1002 and a third port 1003, a first transmission path 1109 between the first port 1001 and the second port 1002 and a second transmission path 1209 between the first port 1001 and the third port 1003. Each transmission path 1109 (1209) comprises two input/output lines 1103 and 1104 (1203 and 1204), a first transmission line 1101 (1201), a second transmission line 1102 (1202), multiple termination switch circuits 1110-1, . . . , 1110-N (1210-1, . . . , 1210-N) (where N is an integer greater than or equal to 2 and n in FIG. 25 is an integer between 1 and N, inclusive), short-circuiting switches 1120-1, . . . , 1120-M (1220-1, . . . , 1220-M) (where M is an integer greater than or equal to 4 and m in FIG. 25 is an integer between 1 and M, inclusive). Specific configurations of the first transmission line 1101 (1201), the second transmission line 1102 (1202), and the termination switch circuits 1110-$n$ (1210-$n$) and the short-circuiting switches 1120-$m$ (1220-$m$) are the same as those in the first embodiments. Requirements that the transmission line 1100 (1200) should satisfy are the same as those in the first embodiment.

The multimode frontend circuit 2000 differs from the multimode frontend circuit 1000 in that the multimode frontend circuit 2000 comprises function selector switches 2141 and 2241. The function selector switch 2141 is a switch connecting the port 1002 to one of terminals 2142 and 2143. The terminal 2142 is connected to a port 2102 (transmission path 1109'). The terminal 2143 is connected to a port 2104 through a line 2011, an intersection 2010, and a line 2013 (transmission path 2109). The function selector switch 2241 is a switch that connects the port 1003 to one of terminals 2242 and 2243. The terminal 2242 is connected to a port 2103 (transmission path 1209'). The terminal 2243 is connected to the port 2104 through a line 2012, an intersection 2010, and a line 2013 (transmission path 2209). The ports 1001, 1002 and 1003 relate to the input/output lines 1103, 1203, 1104 and 1204 in the same manner as in the first embodiment. The lines 1011, 1012, 1013, 1022, 1023, 2011, 2012 and 2013 depict electrical connections. In a real multimode frontend circuit, the lines 1011, 1012, 1013, 1022, 1023, 2011, 2012 and 2013 may have lengths that are negligible in design or may be designed by taking into consideration the lengths.

With the configuration described above, when the function selector switch 2141 connects the port 1002 to the terminal 2142 and the function selector switch 2241 connects the port 1003 to the terminal 2242, the multimode frontend circuit 2000 becomes practically the same in configuration as the multimode frontend circuit 1000. Thus, the same circuit can provide the function of a duplexer operating with variable bandwidths and center frequencies and the function of a switch for TDD.

When the function selector switch 2141 connects the port 1002 to the terminal 2143 and the function selector switch 2241 connects the port 1003 to the terminal 2243, the multimode frontend circuit 2000 becomes a variable dual-band filter capable of passing signals in two frequency bands simultaneously by using the port 1001 as an input port and the port 2104 as an output port.

Implementation of Variable Dual-Band Filter Function

The principle and an example of operation of the multiband frontend circuit functioning as a variable dual-band filter will be described below. To cause the multiband frontend circuit to function as a variable dual-band filter, it is desirable that the transmission coefficient of the filter in a passband be as large as possible (insertion loss be as small as possible). Let F1 denote a passband frequency of the transmission paths 1109 and 2109 and F2 denote a passband frequency of the transmission paths 1209 and 2209. A signal with frequency F1 needs to be transmitted to the transmission paths 1109 and 2109 as losslessly as possible and a signal with frequency F2 needs to be transmitted to the transmission paths 1209 and 2209 as losslessly as possible. To achieve this, the impedance $Z_{11}$ when the transmission paths 1109 and 2109 are viewed from the intersection 1010 and the impedance $Z_{41}$ when the transmission paths 2109 and 1109 are viewed from the intersection 2010 need to be infinite or nearly infinite at frequency F2, and the impedance $Z_{12}$ when the transmission paths 1209 and 2209 are viewed from the intersection 1010 and the impedance $Z_{42}$ when the transmission paths 2209 and 1209 are viewed from the intersection 2010 need to be infinite or nearly infinite at frequency F1. The following example shows that the transmission coefficient in the passband can be increased (that the transmission coefficient can be reduced to nearly 0 dB) by controlling the multimode frontend circuit 2000 so that the conditions given above are satisfied.

Figure 26:
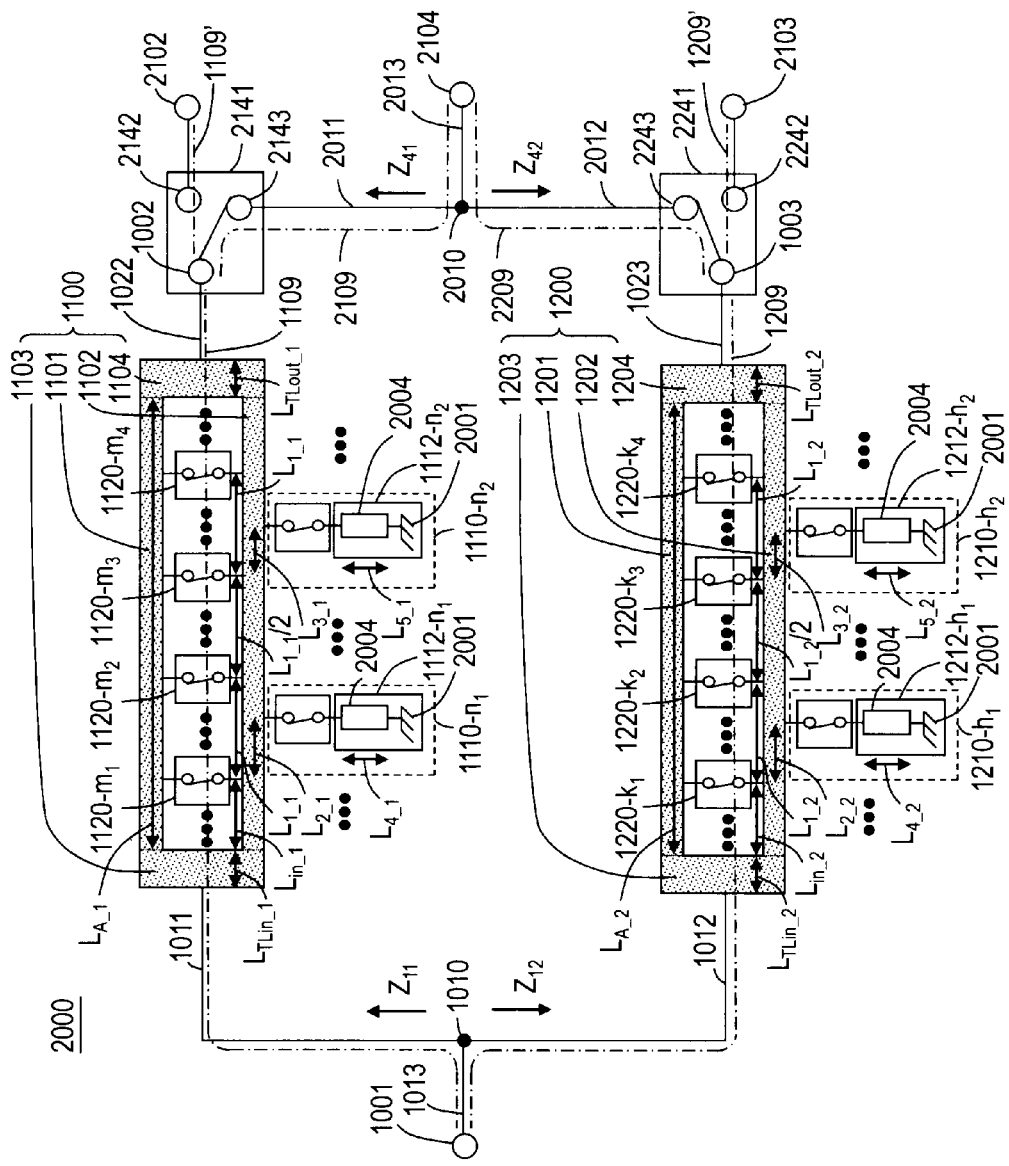
FIG. 26 is a diagram illustrating a configuration of a multimode frontend circuit 2000 functioning as a variable dual-band filter.

FIG. 26 illustrates a configuration of the multimode frontend circuit 2000 functioning as a variable dual-band filter. First, the function selector switch 2141 connects the port 1002 to the terminal 2143 and the function selector switch 2241 connects the port 1003 to the terminal 2243. In the first transmission path 1109, four short-circuiting switches 1120-$m_1$, . . . , 1120-$m_4$ (where $m_1$, . . . , $m_4$ are integers between 1 and M, inclusive, and $m_1 < m_2 < m_3 < m_4$) are turned on and the other short-circuiting switches are turned off. Also in the first transmission path 1109, two termination switch circuits 1110-$n_1$ and 1110-$n_2$ (where $n_1$ and $n_2$ are integers between 1 and N, inclusive, and $n_1 < n_2$) are turned on and the other termination switch circuits are turned off. In the second transmission path 1209, four short-circuiting switches 1220-$k_1$, 1220-$k_4$ (where $k_1, \ldots, k_4$ are integer between 1 and M, inclusive, and $k_1 < k_2 < k_3 < k_4$) are turned on and the other short-circuiting switches are turned off. Also in the second transmission path 1209, two termination switch circuits 1210-$h_1$ and 1210-$h_2$ (where $h_1$ and $h_2$ are integers between 1 and N, inclusive, and $h_1 < h_2$) are turned on and the other termination switch circuits are turned off. Distributed constant lines 2004 connected to a ground conductor 2001 are used as the termination circuits 1112-1, . . . , 1112-N and 1212-1, . . . , 1212-N of the termination switch circuits 1110-1, . . . , 1110-N and 1210-1, . . . , 1210-N.

The length of the first and second transmission line 1101 and 1102 of the first transmission path 1109 is $L_{A\_1}$, the length of the input/output line 1103 is $L_{TLin\_1}$, the length of the input/output line 1104 is $L_{TLout\_1}$, the distance between the input/output line 1103 and the short-circuiting switch 1120-$m_1$ is $L_{in\_1}$, the distance between the short-circuiting switch 1120-$m_1$ and the short-circuiting switch 1120-$m_2$ is $L_{1\_1}$, the distance between the short-circuiting switch 1120-$m_2$ and the short-circuiting switch 1120-$m_3$ is $L_{1\_1}/2$, the distance between the short-circuiting switch 1120-$m_3$ and the short-circuiting switch 1120-$m_4$ is $L_{1\_1}$, the distance between the short-circuiting switch 1120-$m_1$ and the termination switch circuit 1110-$n_1$ is $L_{2\_1}$, the distance between the short-circuiting switch 1120-$m_3$ and the termination switch circuit 1110-$n_2$ is $L_{3\_1}$, the length of the transmission line 2004 of the termination circuit 1112-$n_1$ is $L_{4\_1}$, and the length of the transmission line 2004 of the termination circuit 1112-$n_2$ is $L_{5\_1}$. The length of the first and second transmission lines 1201 and 1202 of the second transmission path 1209 is $L_{A\_2}$, the length of the input/output line 1203 is $L_{TLin\_2}$, the length of the input/output line 1204 is $L_{TLout\_2}$, the distance between the input/output line 1203 and the short-circuiting switch 1220-$k_1$ is $L_{in\_2}$, the distance between the short-circuiting switch 1220-$k_1$ and the short-circuiting switch 1220-$k_2$ is $L_{1\_2}$, the distance between the short-circuiting switch 1220-$k_2$ and the short-circuiting switch 1220-$k_3$ is $L_{1\_2}/2$, the distance between the short-circuiting switch 1220-$k_3$ and the short-circuiting switch 1220-$k_4$ is $L_{1\_2}$, the distance between the short-circuiting switch 1220-$k_1$ and the termination switch circuit 1210-$h_1$ is $L_{2\_2}$, the distance between the short-circuiting switch 1220-$k_3$ and the termination switch circuit 1210-$h_2$ is $L_{3\_2}$, the length of the transmission line 2004 of the termination circuit 1212-$h_1$ is $L_{4\_2}$ and the length of the transmission line 2004 of the termination circuit 1212-$h_2$ is $L_{5\_2}$.

Figure 27:
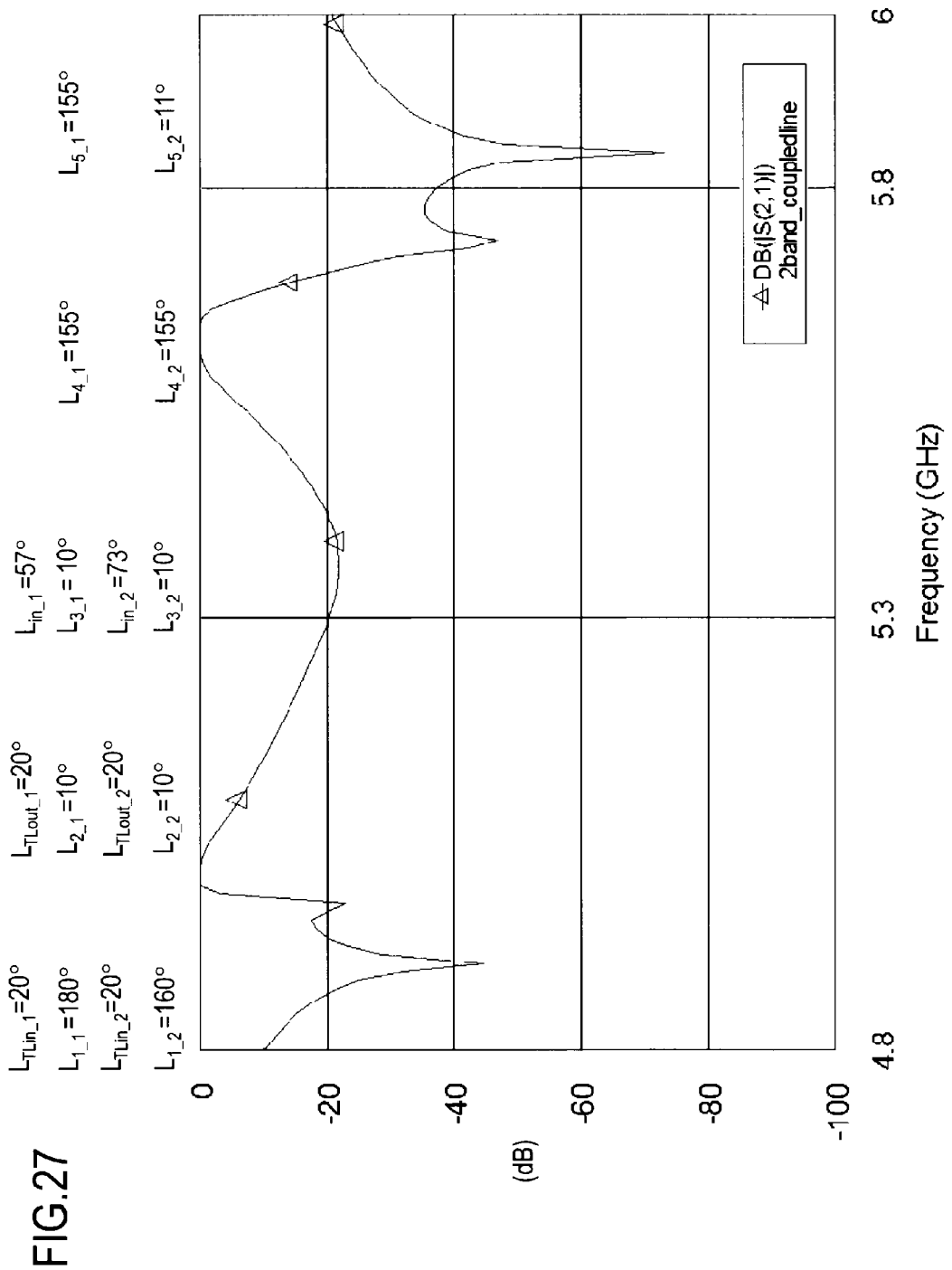
FIG. 27 is a diagram illustrating the transmission coefficient from a port 1001 to a port 2104 when electrical lengths at 5 GHz are set as $L_{A\_1}$=720°, $L_{TLin\_1}$=20°, $L_{TLout\_1}$=20°, $L_{in\_1}$=57°, $L_{1\_1}$=180°, $L_{2\_1}$=10°, $L_{3\_1}$=10°, $L_{3\_1}$=10°, $L_{4\_1}=155°$, $L_{5\_1}=155°$, $L_{A\_2}=720°$, $L_{TLin\_2}=20°$, $L_{TLout\_2}=20°$, $L_{in\_2}=73°$, $L_{1\_2}=160°$, $L_{2\_2}=10°$, $L_{3\_2}=10°$, $L_{4\_2}=155°$, and $L_{5\_2}=11°$.

FIG. 27 illustrates the transmission coefficient from the port 1001 to the port 2104 when the electrical lengths at 5 GHz are set as follows: $L_{A\_1}=720°$, $L_{TLin\_1}=20°$, $L_{TLout\_1}=20°$, $L_{in\_1}=57°$, $L_{1\_1}=180°$, $L_{2\_1}=10°$, $L_{3\_1}=10°$, $L_{4\_1}=155°$, $L_{5\_1}=155°$, $L_{A\_2}=720°$, $L_{TLin\_2}=20°$, $L_{TLout\_2}=20°$, $L_{in\_2}=73°$, $L_{1\_2}=160°$, $L_{2\_2}=10°$, $L_{3\_2}=10°$, $L_{4\_2}=155°$ and $L_{5\_2}=11°$. The horizontal axis of the graph in FIG. 27 represents frequency and the vertical axis represents transmission coefficient (dB). Under the conditions given above, there are passbands of 5 GHz and 5.62 GHz and the transmission coefficient in the two passbands is almost 0 dB. Since the electrical length $L_{1\_1}$ is 180° at 5 Hz, the passband of the transmission paths 1109 and 2109 is 5 GHz. The electrical length $L_{1\_2}$ at 5 Hz is 160°, which is 180° at 5.62 GHz. Accordingly, the passband of the transmission paths 1209 and 2209 is 5.62 GHz.

Figure 28A:
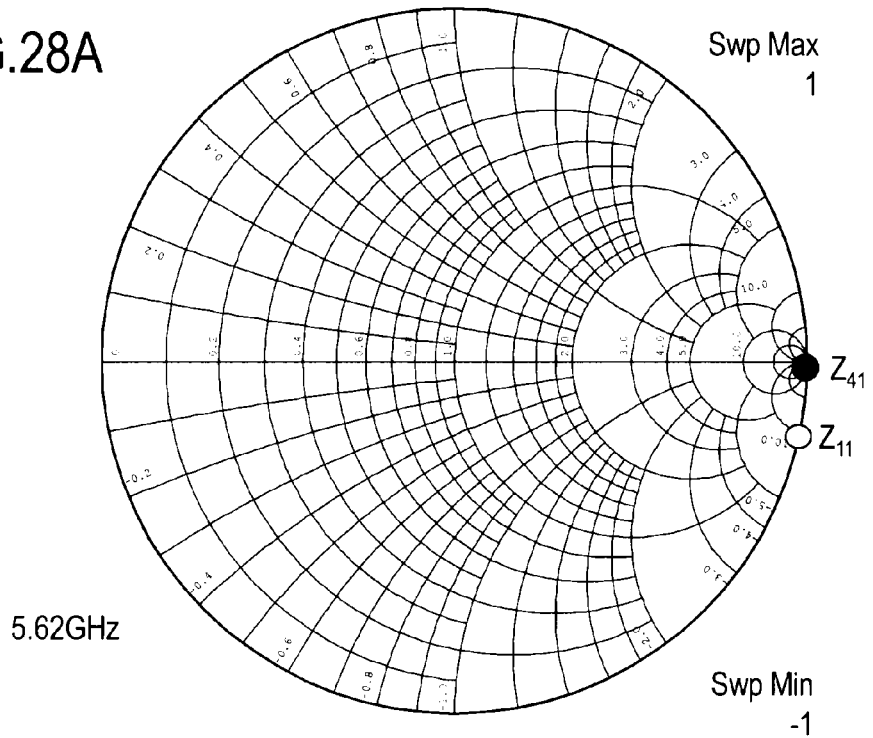
FIG. 28A is a diagram illustrating impedance in the example in FIG. 27 at 5.62 GHz.
Figure 28B:
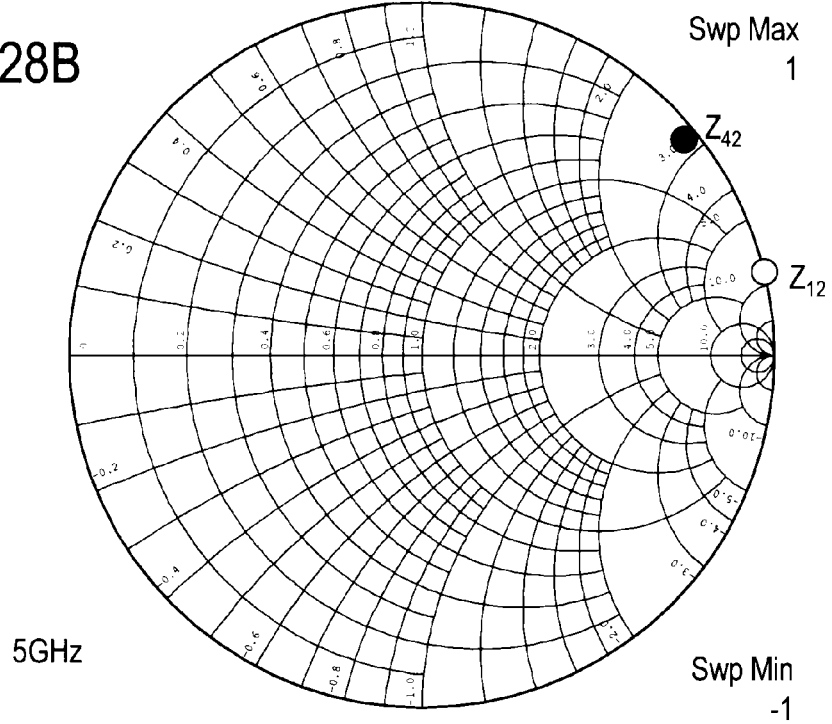
FIG. 28B is a diagram illustrating impedance in the example in FIG. 27 at 5 Hz.

FIG. 28A is a Smith chart illustrating impedances $Z_{11}$ and $Z_{41}$ at 5.62 GHz in FIG. 27. FIG. 28B is a Smith chart illustrating impedances $Z_{12}$ and $Z_{42}$ at 5 GHz in FIG. 27. As can be seen, the impedances $Z_{11}$ and $Z_{41}$ at 5.62 GHz are infinite or nearly infinite. Accordingly, a signal with 5.62 GHz does not propagate to the transmission paths 1109 and 2109 but propagates through the transmission paths 1209 and 2209, then is output through the port 2104. The impedances $Z_{12}$ and $Z_{42}$ at 5 Hz are infinite or nearly infinite. Accordingly, a signal with 5 GHz does not propagate to the transmission paths 1209 and 2209 but propagates through the transmission paths 1109 and 2109, then is output through the port 2104.

Figure 29:
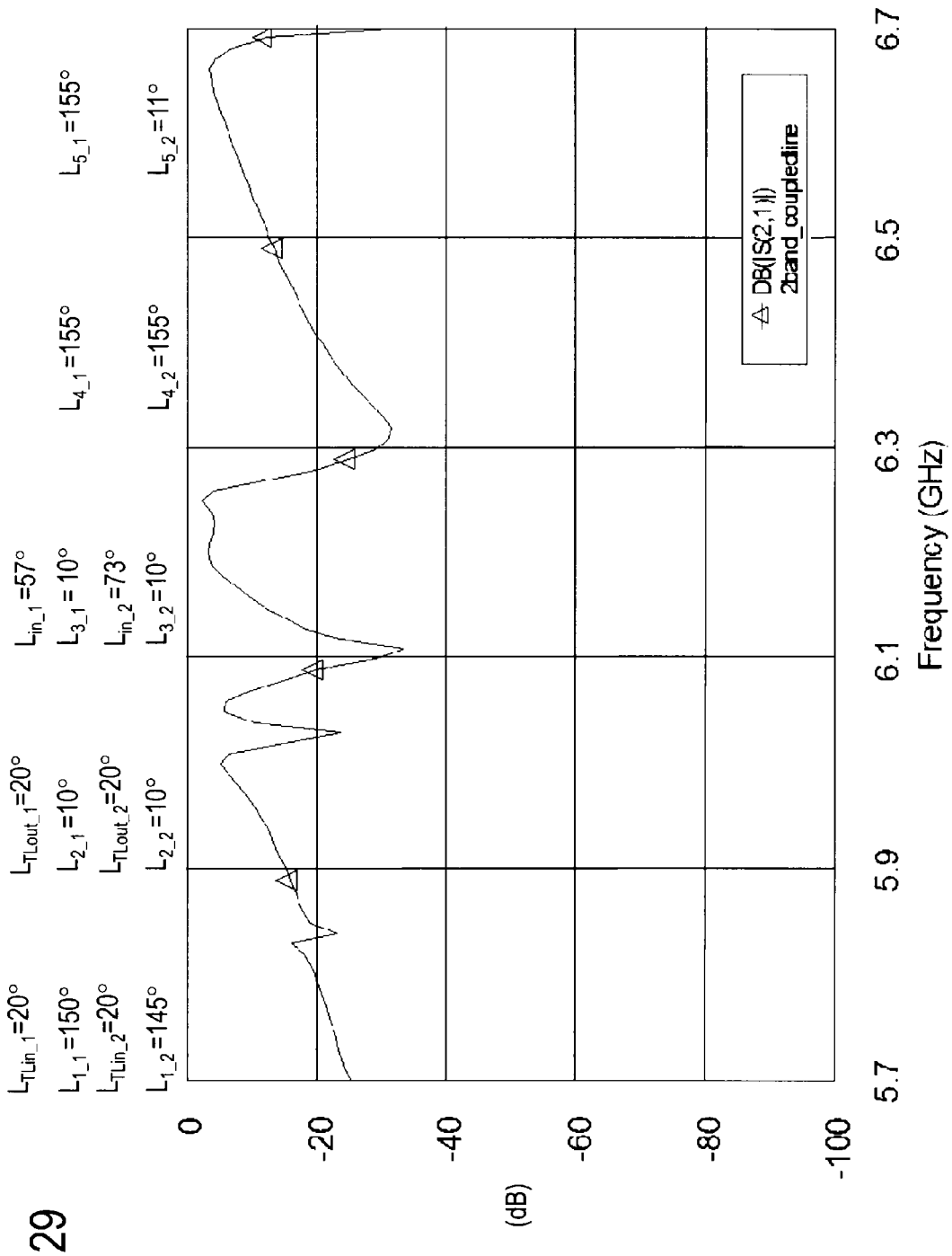
FIG. 29 is a diagram illustrating the transmission coefficient from the port 1001 to the port 2104 when electrical lengths at 5 GHz are set as $L_{A\_1}=720°$, $L_{TLin\_1}=20°$, $L_{TLout\_1}=20°$, $L_{in\_1}=57°$, $L_{1\_1}=150°$, $L_{2\_1}=10°$, $L_{3\_1}=10°$, $L_{4\_1}=155°$, $L_{5\_1}=155°$, $L_{A\_2}=720°$, $L_{TLin\_2}=20°$, $L_{TLout\_2}=20°$, $L_{in\_2}=73°$, $L_{1\_2}=145°$, $L_{2\_2}=10°$, $L_{3\_2}=10°$, $L_{4\_2}=155°$ and $L_{5\_2}=11°$.

FIG. 29 illustrates the transmission coefficient from the port 1001 to the port 2104 when the electrical lengths at 5 GHz are set as follows: $L_{A\_1}=720°$, $L_{TLin\_1}=20°$, $L_{TLout\_1}=20°$, $L_{in\_1}=57°$, $L_{1\_1}=150°$, $L_{2\_1}=10°$, $L_{3\_1}=10°$, $L_{4\_1}=155°$, $L_{5\_1}=155°$, $L_{A\_2}=720°$, $L_{TLin\_2}=20°$, $L_{TLout\_2}=20°$, $L_{in\_2}=73°$, $L_{1\_2}=145°$, $L_{2\_2}=10°$, $L_{3\_2}=10°$, $L_{4\_2}=155°$ and $L_{5\_2}=11°$. The conditions in FIG. 29 differ from the conditions in FIG. 27 only in the lengths $L_{1\_1}$, and $L_{1\_2}$. The horizontal axis of the graph in FIG. 29 represents frequency and the vertical axis represents transmission coefficient (dB). The electrical length $L_{1\_1}$ is 150° at 5 GHz and 180° at 6 GHz. Accordingly the passband of the transmission paths 1109 and 2109 would be 6 GHz. The electrical length $L_{1\_2}$ is 145° at 5 GHz and 180° at 6.18 GHz. Accordingly, the passband of the transmission paths 1209 and 2209 would be 6.18 GHz. As can be seen from FIG. 29, however, the transmission coefficients at 6 GHz and 6.18 GHz, which would be the passbands, are small.

Figure 30A:
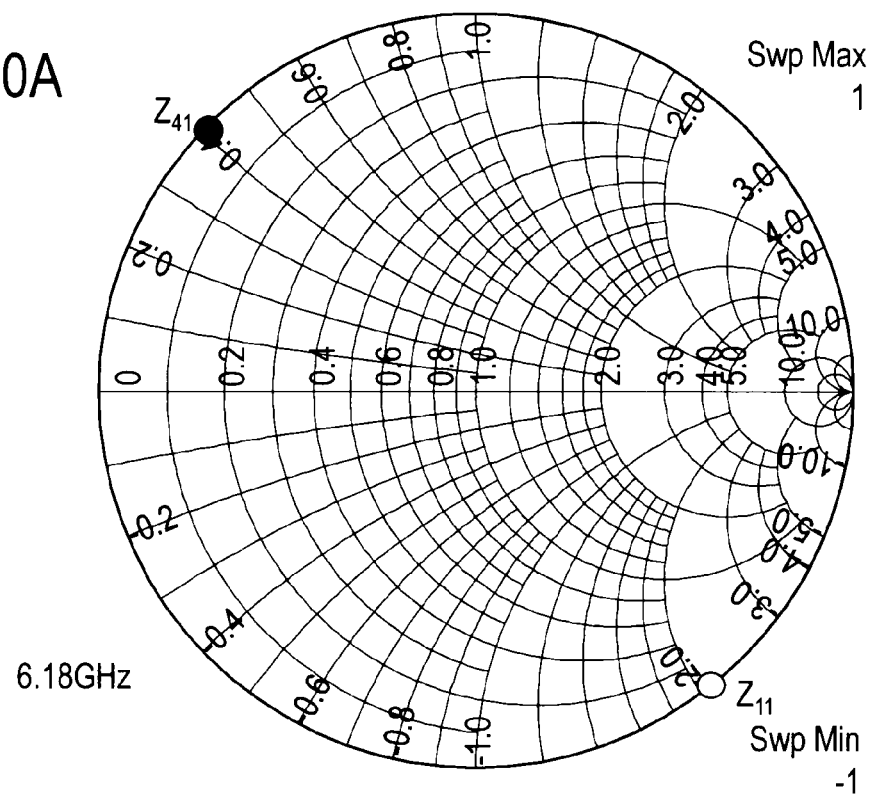
FIG. 30A is a diagram illustrating impedance in the example in FIG. 29 at 6.18 GHz.
Figure 30B:
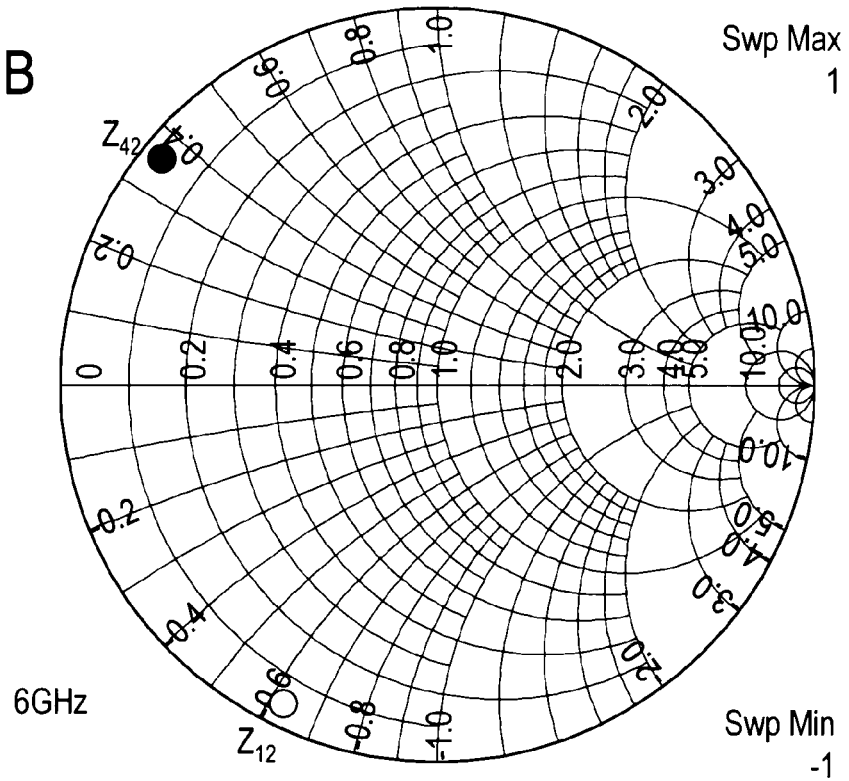
FIG. 30B is a diagram illustrating impedance in the example in FIG. 29 at 6 GHz.

FIG. 30A is a Smith chart illustrating impedances $Z_{11}$ and $Z_{41}$ at 6.18 GHz in FIG. 29. FIG. 30B is a Smith chart illustrating impedances $Z_{12}$ and $Z_{42}$ at 6 GHz in FIG. 29. The impedances $Z_{11}$ and $Z_{41}$ at 6.18 GHz are far from infinite (the impedances are small). Also, the impedances $Z_{12}$ and $Z_{42}$ at 6 GHz are far from infinite (the impedances are small). This means that the multimode frontend circuit cannot be caused to function as a variable dual-band filter with a large transmission coefficient by adjusting only $L_{1\_1}$ and $L_{1\_2}$, which are resonator lengths.

Figure 31:
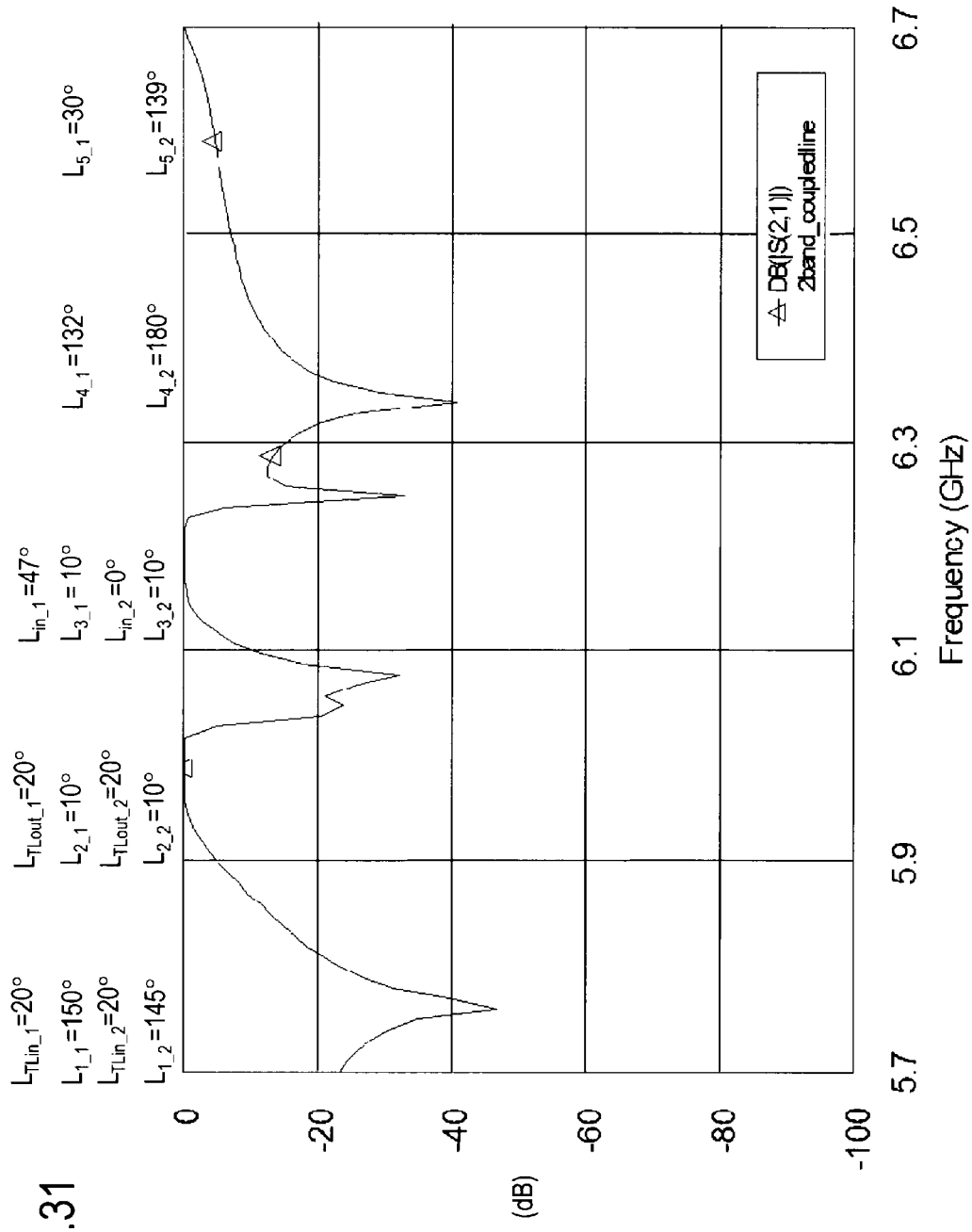
FIG. 31 is the transmission coefficient from the port 1001 to the port 2104 when electrical lengths at 5 GHz are set as $L_{A\_1}=720°$, $L_{TLin\_1}=20°$, $L_{TLout\_1}=20°$, $L_{in\_1}=47°$, $L_{1\_1}=150°$, $L_{2\_1}=10°$, $L_{3\_1}=10°$, $L_{4\_1}=132°$, $L_{5\_1}=30°$, $L_{A\_2}=720°$, $L_{TLin\_2}=20°$, $L_{TLout\_2}=20°$, $L_{in\_2}=0°$, $L_{1\_2}=145°$, $L_{2\_2}=10°$, $L_{3\_2}=10°$, $L_{4\_2}=180°$ and $L_{5\_2}=139°$.

Therefore, in addition to the resonator lengths ($L_{1\_1}$ and $L_{1\_2}$), other lengths are adjusted so that the impedances $Z_{11}$ and $Z_{41}$ approach infinite at 6.18 GHz and the impedances $Z_{12}$ and $Z_{42}$ approach infinite at 6 GHz. FIG. 31 illustrates the transmission coefficient from the port 1001 to the port 2104 when the electrical lengths at 5 GHz are set as follows: $L_{A\_1}=720°$, $L_{TLin\_1}=20°$, $L_{TLout\_1}=20°$, $L_{in\_1}=47°$, $L_{1\_1}=150°$, $L_{2\_1}=10°$, $L_{3\_1}=10°$, $L_{4\_1}=132°$, $L_{5\_1}=30°$, $L_{A\_2}=720°$, $L_{TLin\_2}=20°$, $L_{TLout\_2}=20°$, $L_{in\_2}=0°$, $L_{1\_2}=145°$, $L_{2\_2}=10°$, $L_{3\_2}=10°$, $L_{4\_2}=180°$ and $L_{5\_2}=139°$. The horizontal axis of the graph in FIG. 31 represents frequency and the vertical axis represents transmission coefficient (dB). The transmission coefficient is almost 0 dB in 6-GHz and 6.18-GHz passbands. The conditions in FIG. 31 are different from the conditions in FIG. 29 in lengths $L_{in\_1}$, $L_{4\_1}, L_{5\_1}, L_{in\_2}, L_{4\_2}$ and $L_{5\_2}$. Especially, the lengths $L_{in\_1}$ and $L_{in\_2}$ are parameters that determine the distance from the input/output line to the first resonator and act as variable phase shifters. This solution uses the characteristic of a variable filter that the parallel lines can be caused to function both as a resonator and merely as a transmission line.

Figure 32A:
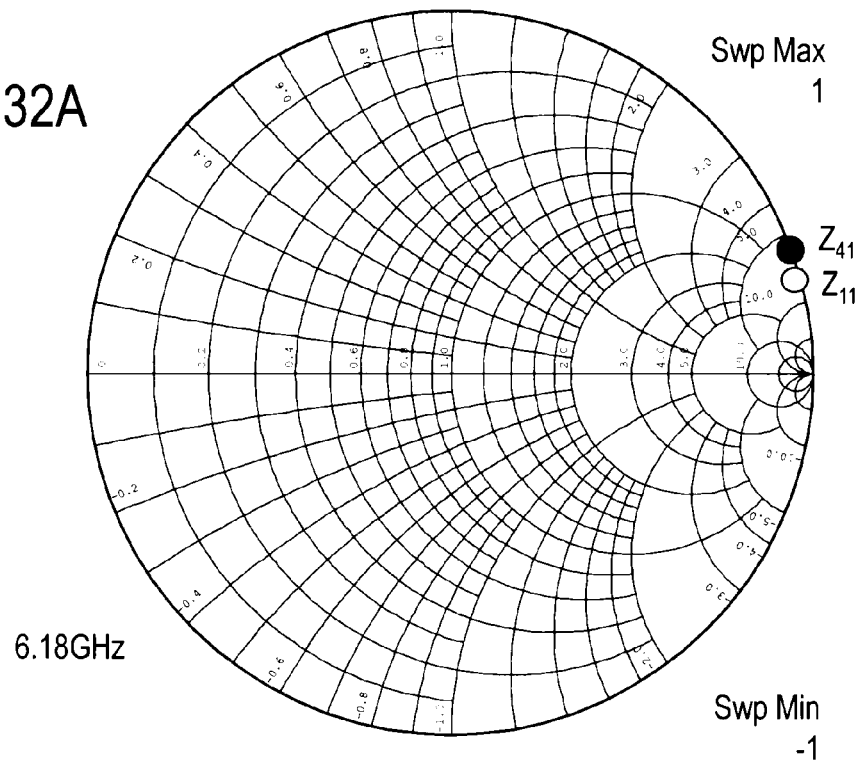
FIG. 32A is a diagram illustrating impedance in the example in FIG. 31 at 6.18 GHz.
Figure 32B:
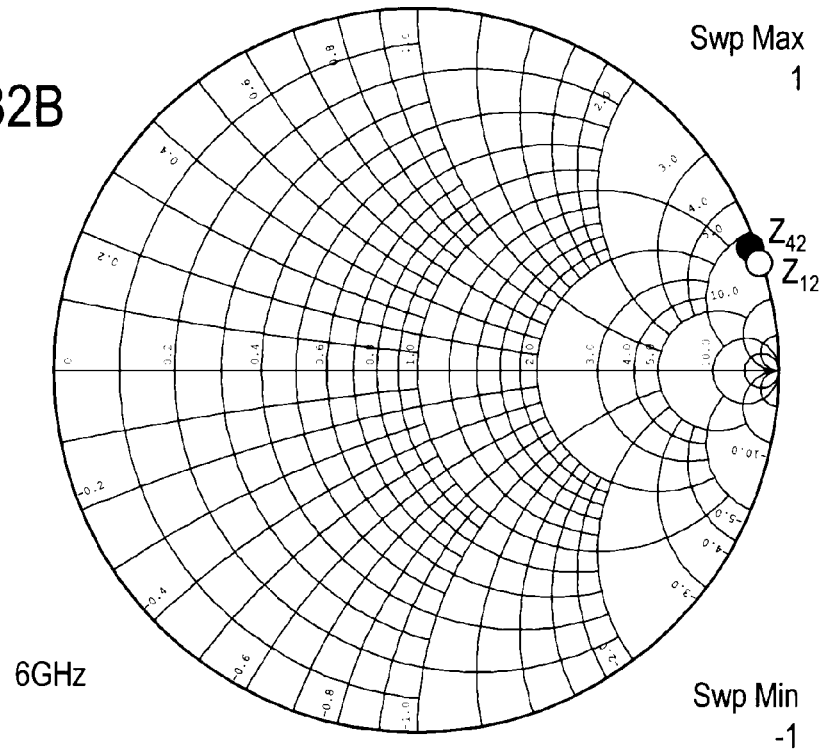
FIG. 32B is a diagram illustrating impedance in the example in FIG. 31 at 6 GHz.

FIG. 32A is a Smith chart illustrating impedances $Z_{11}$ and $Z_{41}$ at 6.18 GHz in FIG. 31. FIG. 32B is a Smith chart illustrating impedances $Z_{12}$ and $Z_{42}$ at 6.18 GHz in FIG. 31. As shown, the impedances $Z_{11}$ and $Z_{41}$ are nearly infinite at 6.18 GHz. Accordingly, a signal with a frequency of 6.18 GHz does not propagate to the transmission paths 1109 and 2109 but propagates through the transmission paths 1209 and 2209, then is output through the port 2104. Also, the impedances $Z_{12}$ and $Z_{42}$ are nearly infinite at 6 GHz. Accordingly, a signal with a frequency of 6 GHz does not propagate to the transmission paths 1209 and 2209 but propagates through the transmission paths 1109 and 2109, then is output through the port 2104. Thus, under the conditions in FIG. 31, the transmission coefficient is almost 0 dB in the 6-GHz and 6.18-GHz passbands.

Figure 33:
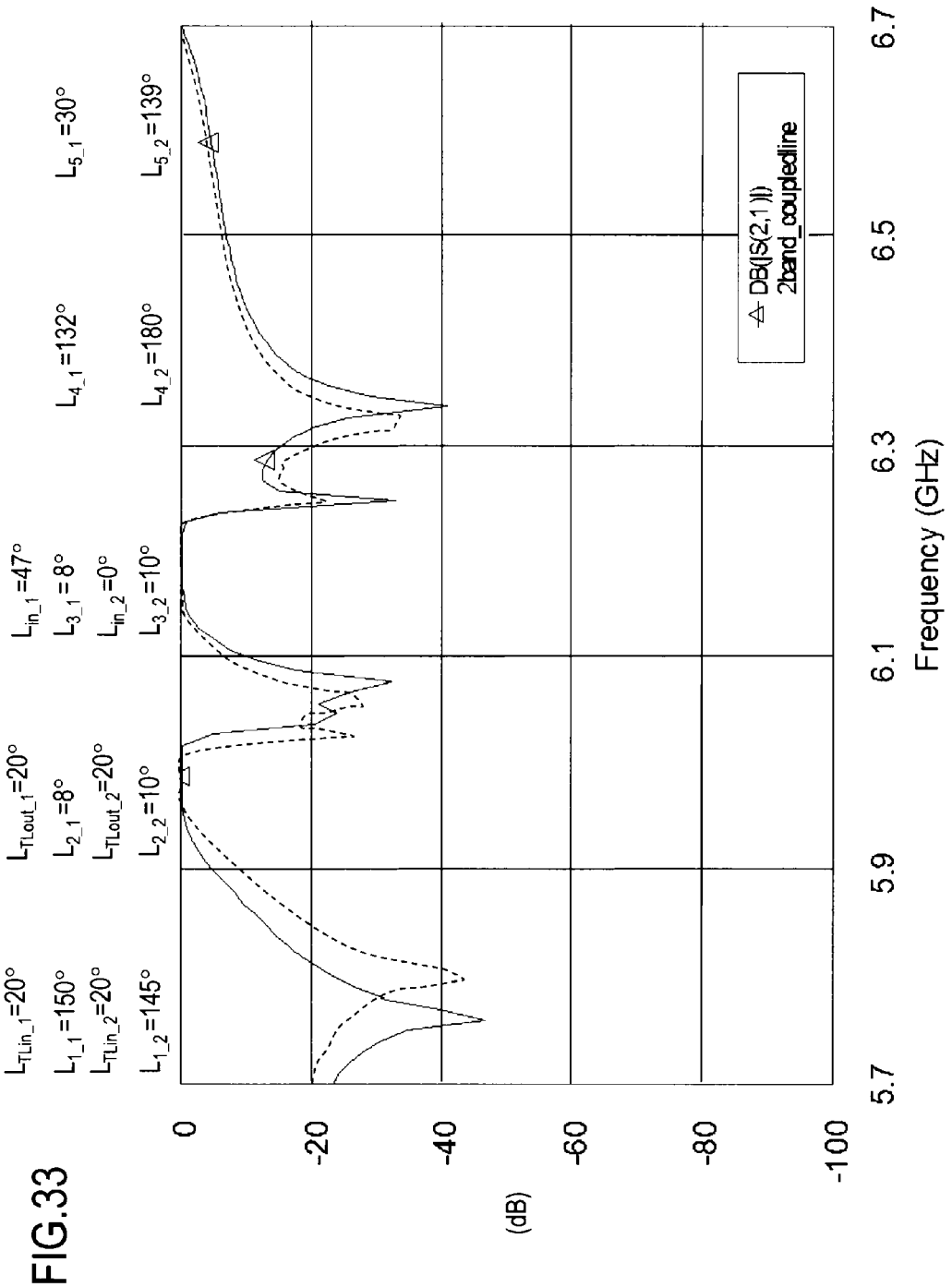
FIG. 33 is a diagram illustrating the transmission coefficient from the port 1001 to the port 2104 when electrical lengths at 5 GHz are set as $L_{A\_1}=720°$, $L_{TLin\_1}=20°$, $L_{TLout\_1}=20°$, $L_{in\_1}=47°$, $L_{1\_1}=150°$, $L_{2\_1}=8°$, $L_{3\_1}=8°$, $L_{4\_1}=132°$, $L_{5\_1}=30°$, $L_{A\_2}=720°$, $L_{TLin\_2}=20°$, $L_{TLout\_2}=20°$, $L_{in\_2}=0°$, $L_{1\_2}145°$, $L_{2\_2}=10°$, $L_{3\_2}=10°$, $L_{4\_2}=180°$, and $L_{5\_2}=139°$.

An example of changing the bandwidth of a passband will be described below. FIG. 33 illustrates the transmission coefficient from the port 1001 to the port 2104 when the electrical lengths at 5 GHz are set as follows: $L_{A\_1}=720°$, $L_{TLin\_1}=20°$, $L_{TLout\_1}=20°$, $L_{in\_1}=47°$, $L_{1\_1}=150°$, $L_{2\_1}=8°$, $L_{3\_1}=8°$, $L_{4\_1}=132°$, $L_{5\_1}=30°$, $L_{A\_2}=720°$, $L_{TLin\_2}20°$, $L_{TLout\_2}=20°$, $L_{in\_2}=0°$, $L_{1\_2}=145°$, $L_{2\_2}=10°$, $L_{3\_2}=10°$, $L_{4\_2}=180°$ and $L_{5\_2}=139°$. The horizontal axis of the graph in FIG. 33 represents frequency and the vertical axis represents transmission coefficient (dB). The dashed curve represents the transmission coefficient under the conditions given above and the solid curve represents the transmission coefficient under the conditions in FIG. 31. The conditions in FIG. 33 differ from the conditions in FIG. 31 only in the lengths $L_{2\_1}$ and $L_{3\_1}$. It can be seen that the change of the lengths on the transmission paths 1109, 2109 side significantly changes the bandwidth in the 6-GHz band but does not significantly change the bandwidth in the 6.18 GHz. It can also be seen that the center frequency of the 6-GHz band is kept constant. This solution uses the characteristic of a variable filter that the bandwidth can be changed while keeping the center frequency constant.

Figure 34:
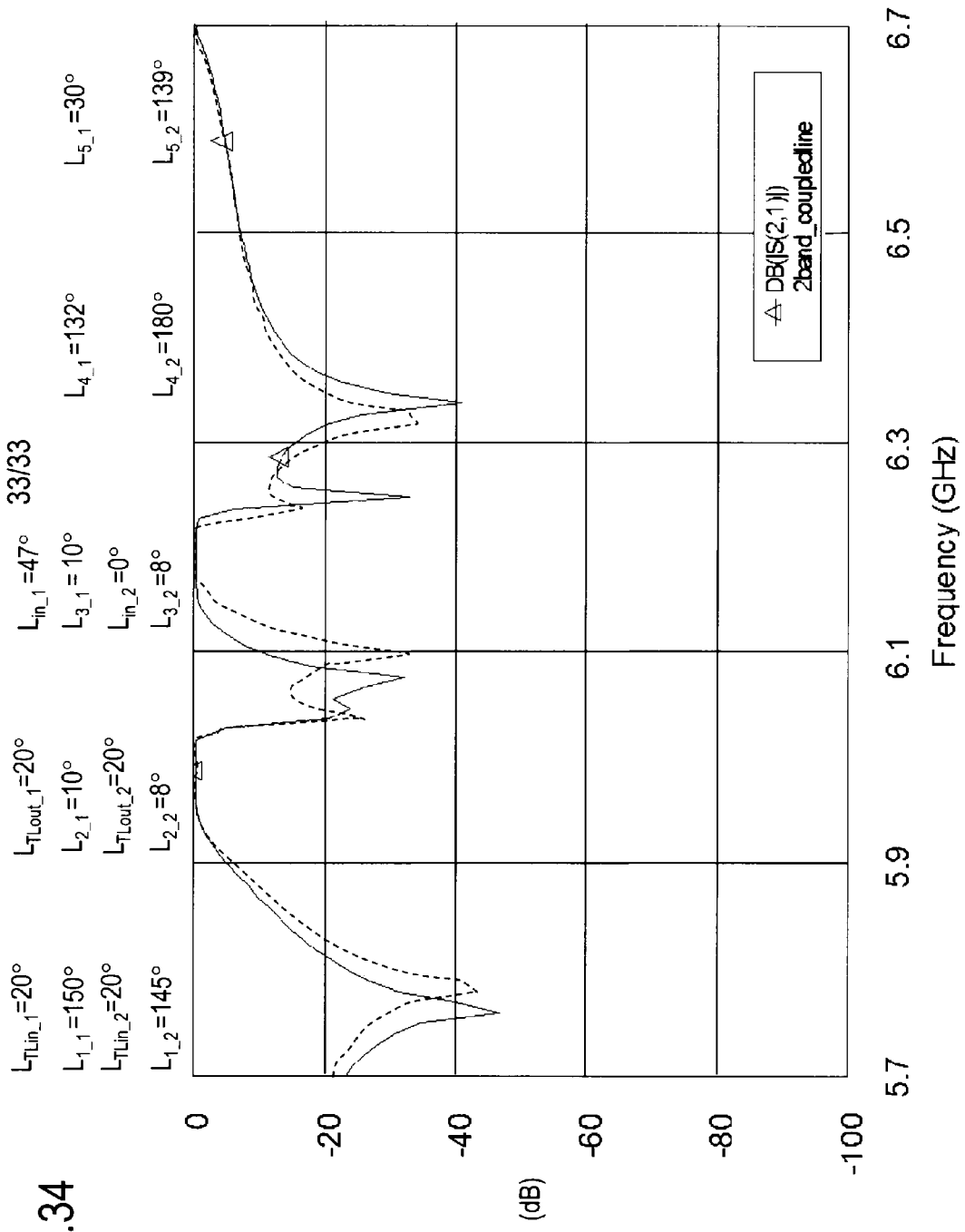
FIG. 34 is a diagram illustrating the transmission coefficient from the port 1001 to the port 2104 when electrical lengths at 5 GHz are set as $L_{A\_1}=720°$, $L_{TLin\_1}=20°$, $L_{TLout\_1}=20°$, $L_{in\_1}=47°$, $L_{1\_1}=150°$, $L_{2\_1}=10°$, $L_{3\_1}=10°$, $L_{4\_1}=132°$, $L_{5\_1}=30°$, $L_{A\_2}=720°$, $L_{TLin\_2}=20°$, $L_{TLout\_2}=0°$, $L_{in\_2}=0°$, $L_{1\_2}=145°$, $L_{2\_2}=8°$, $L_{3\_2}=8°$, $L_{4\_2}=180°$ and $L_{5\_2}=139°$.

FIG. 34 illustrates the transmission coefficient from the port 1001 to the port 2104 when the electrical lengths at 5 GHz are set as follows: $L_{A\_1}=720°$, $L_{TLin\_1}=20°$, $L_{TLout\_1}=20°$, $L_{in\_1}=47°$, $L_{1\_1}=150°$, $L_{2\_1}=10°$, $L_{3\_1}=10°$, $L_{4\_1}=132°$, $L_{5\_1}=30°$, $L_{A\_2}=720°$, $L_{TLin\_2}=20°$, $L_{TLout\_2}=20°$, $L_{in\_2}=0°$, $L_{1\_2}=145°$, $L_{2\_2}=8°$, $L_{3\_2}=8°$, $L_{4\_2}=180°$ and $L_{5\_2}=139°$. The horizontal axis of the graph in FIG. 34 represents frequency and the vertical axis represents transmission coefficient (dB). The dashed curve represents the transmission coefficient under the conditions given above and the solid curve represents the transmission coefficient under the conditions in FIG. 31. The conditions in FIG. 34 differ from the conditions in FIG. 31 only in the lengths $L_{2\_2}$ and $L_{3\_2}$. It can be seen that the change of the lengths on the transmission paths 1209, 2209 side significantly changes the bandwidth in the 6.18-GHz band but does not significantly change the bandwidth in the 6-GHz band. It can also be seen that the center frequency of the 6.18-GHz band is kept constant. This solution uses the characteristic of a variable filter that the bandwidth can be changed while keeping the center frequency constant.

The termination circuits 1112-1, ..., 1112-N and 1212-1, ..., 1212-N of the termination switch circuits 1110-1, ..., 1110-N and 1210-1, ..., 1210-N in FIG. 26 use the transmission line 2004 connected to the ground conductor 2001. However, other circuits, including but not limited to, the circuits illustrated in FIGS. 22I, 22J, 22K, 22N and 22Q can be used instead.

As described above, the multimode frontend circuit of the second embodiment can be configured to have the configuration equivalent to that of the multimode frontend circuit of the first embodiment by switching the function selector switches. Accordingly, the multimode frontend circuit of the second embodiment offers the same effects as those of the multimode frontend circuit of the first embodiment. Furthermore, the multimode frontend circuit of the second embodiment can be caused to function as a variable dual-band filter as well by appropriately setting the function selector switches. When the multimode frontend circuit of the second embodiment is caused to function as a variable dual-band filter, the center frequency and bandwidth of each passband can be changed individually.

What is claimed is:

1. A multimode frontend circuit comprising first, second and third ports, a first transmission path between the first and second ports, and a second transmission path between the first and third ports,
each of the transmission paths comprising:
two input/output lines;
a first transmission line having one end connected to one of the input/output lines and the other end connected to the other input/output line;
a second transmission line having one end connected to the one of the input/output lines and the other end connected to the other input/output line; and
one or a plurality of termination switch circuits;
wherein:
the electrical length of the first transmission line is equal to the electrical length of the second transmission line;
a characteristic impedance for an even mode and a characteristic impedance for an odd mode of the first transmission line are constant along the length of the first transmission line;
a characteristic impedance for an even mode and a characteristic impedance for an odd mode of the second transmission line are constant along the length of the second transmission line;
the characteristic impedance for the even mode of the first transmission line is equal to the characteristic impedance for the even mode of the second transmission line;
the characteristic impedance for the odd mode of the first transmission line is equal to the characteristic impedance for the odd mode of the second transmission line; and
each of the one or plurality of termination switch circuits comprises a switch and a termination circuit, one end of the switch being connected to one of the first and second transmission lines, the termination circuit being connected to the other end of the switch.

2. The multimode frontend circuit according to claim 1, wherein the first and second transmission lines have the same length and the same line width and the distance between the first and second transmission lines is constant along the length of the first and second transmission lines.

3. The multimode frontend circuit according to claim 1, wherein:
included among the termination switch circuits of the transmission paths is a set of termination switch circuits connected to the different transmission lines at points at the same electrical length from one of the input/output lines.

4. The multimode frontend circuit according to claim 1, wherein the termination circuit is a reactance circuit.

5. The multimode frontend circuit according to claim 4, wherein the reactance circuit is a variable reactance circuit.

6. The multimode frontend circuit according to claim 1, wherein:
   each of the transmission paths comprises one or more short-circuiting switches; and
   the one or more short-circuiting switches are capable of short-circuiting between the first and second transmission lines at points at the same electrical length from one of the input/output lines.

7. The multimode frontend circuit according to claim 6, wherein:
   included among the termination switch circuits and the short-circuiting switches is a termination switch circuit and a short-circuiting switch that are connected at the same position on the first or second transmission line.

8. The multimode frontend circuit according to claim 6, wherein:
   the number of the short-circuiting switches is greater than or equal to two; and
   included among the termination switch circuits is a termination switch circuit connected to the transmission line between positions at which two of the short-circuiting switches are connected.

9. The multimode frontend circuit according to claim 6, further comprising a function selector switch for alternately connecting and disconnecting the second and third ports to each other,
   wherein each of the transmission paths comprises two or more of the termination switch circuits and four or more of the short-circuiting switches.

* * * * *